US012066497B2

(12) United States Patent
Cummings et al.

(10) Patent No.: US 12,066,497 B2
(45) Date of Patent: Aug. 20, 2024

(54) MODULAR POWER SUPPLY

(71) Applicant: BAE Systems Controls Inc., Endicott, NY (US)

(72) Inventors: Thomas J. Cummings, Endwell, NY (US); Peter A. Carruthers, Ithaca, NY (US); David J. Czebiniak, Newark Valley, NY (US); John P. Zielinski, Lyman, SC (US)

(73) Assignee: BAE Systems Controls Inc., Endicott, NY (US)

( * ) Notice: Subject to any disclaimer, the term of this patent is extended or adjusted under 35 U.S.C. 154(b) by 638 days.

(21) Appl. No.: 17/299,633

(22) PCT Filed: Feb. 24, 2021

(86) PCT No.: PCT/US2021/019329
§ 371 (c)(1),
(2) Date: Jun. 3, 2021

(87) PCT Pub. No.: WO2021/221769
PCT Pub. Date: Nov. 4, 2021

(65) Prior Publication Data
US 2023/0349984 A1    Nov. 2, 2023

(51) Int. Cl.
*G01R 31/42* (2006.01)
*G01R 31/00* (2006.01)
(Continued)

(52) U.S. Cl.
CPC ........... *G01R 31/42* (2013.01); *G01R 31/006* (2013.01); *H02H 3/165* (2013.01); *H02H 3/347* (2013.01);
(Continued)

(58) Field of Classification Search
CPC ...... G01R 31/42; G01R 31/52; G01R 31/006; H02H 3/165; H02H 3/347; H02M 1/36;
(Continued)

(56) References Cited

U.S. PATENT DOCUMENTS

2005/0151517 A1    7/2005  Cook et al.
2011/0304966 A1   12/2011  Schrempp
(Continued)

FOREIGN PATENT DOCUMENTS

CA        3170951 A1 * 12/2022

OTHER PUBLICATIONS

International Search Report, PCT/US21/19329, mailed May 3, 2021, 9 pages.
(Continued)

*Primary Examiner* — Arnold M Kinkead
(74) *Attorney, Agent, or Firm* — Scott J. Asmus; Gary McFaline; Scully Scott Murphy & Presser PC

(57) ABSTRACT

A power supply includes an I/O module configured to receive a high voltage DC input and output a high voltage DC, a plurality of DC converter modules configured to receive the high voltage DC output from the I/O module and output a low voltage DC output, and a plurality of AC inverter modules configured to receive the high voltage DC output from the I/O module and output a high voltage AC output. Each of the plurality of DC converter modules, each of the plurality of AC inverter modules and the I/O module may be mounted in a corresponding individual chassis. Each of the individual chassis may be configured to be stackable together into a single line replaceable unit (LRU). Each of the individual chassis may have an identically shaped outer frame.

16 Claims, 19 Drawing Sheets

(51) Int. Cl.
*G01R 31/52* (2020.01)
*H02H 3/16* (2006.01)
*H02H 3/347* (2006.01)
*H02M 1/00* (2007.01)
*H02M 1/12* (2006.01)
*H02M 1/32* (2007.01)
*H02M 1/36* (2007.01)
*H02M 7/44* (2006.01)
*H02M 7/5387* (2007.01)

(52) U.S. Cl.
CPC .......... *H02M 1/008* (2021.05); *H02M 1/123* (2021.05); *H02M 1/32* (2013.01); *H02M 1/36* (2013.01); *H02M 7/44* (2013.01); *H02M 7/5387* (2013.01); *G01R 31/52* (2020.01); *H02J 2310/48* (2020.01)

(58) Field of Classification Search
CPC .......... H02M 7/44; H02M 1/123; H02M 1/32; H02M 7/5387; H02M 1/008; H02J 2310/48; Y02T 10/70

USPC ............................................ 307/58; 323/207
See application file for complete search history.

(56) References Cited

U.S. PATENT DOCUMENTS

| | | | |
|---|---|---|---|
| 2014/0008977 A1* | 1/2014 | Koukkari | H02J 4/00 307/23 |
| 2014/0232313 A1 | 8/2014 | Nakajima et al. | |
| 2018/0015831 A1 | 1/2018 | Rozman et al. | |
| 2019/0389406 A1 | 12/2019 | Mancini et al. | |
| 2020/0070672 A1* | 3/2020 | Vahedi | H02J 7/35 |

OTHER PUBLICATIONS

Independent Ground Fault Detection Using Current Transformer, U.S. Appl. No. 16/861,375, filed Apr. 29, 2020.

* cited by examiner

MODULAR POWER SUPPLY

BACKGROUND

FIG. 1 is a block diagram of a prior art vehicle power management system 10. The vehicle power management system 10 includes an energy storage system (ESS) 12. The energy storage system 12 may include a plurality of battery modules for a hybrid electric or electric vehicle. The vehicle power management system 10 also includes a propulsion control system (PCS) 14 which controls an integrated starter generator (ISG) 16 and a motor 18. A system control unit (SCU) 20 controls the propulsion control system 14 and an accessory power system (APS) 22. The accessory power system 22 receives DC energy from the energy storage system 12 and converts the energy into 3-phase AC power. The accessory power system 22 provides the 3-phase power to a power distribution system (PDU) 26. The power distribution system 26 provides 3-phase power to separate accessory units such as power steering unit 28, air conditioning unit 30 and air compressor unit 32. The accessory power system 22 also provides DC power to charge a 28 volt battery 24.

The vehicle power management system 10 is designed and built for a specific application having specific power requirements. The current vehicle power management system has no flexibility in its power outputs and is standard across all OEMs. Because the accessory power system is rated to handle all applications, this results in many, if not all, applications to underutilize the power converters in the accessory power system. The vehicle power management system 10 is not scalable to adapt to systems having varying power requirements.

BRIEF SUMMARY

A power supply is disclosed including an I/O module configured to receive a high voltage DC input and output a high voltage DC, a plurality of DC converter modules configured to receive the high voltage DC output from the I/O module and output a low voltage DC output, and a plurality of AC inverter modules configured to receive the high voltage DC output from the I/O module and output a high voltage AC output. In one embodiment, each of the plurality of DC converter modules, each of the plurality of AC inverter modules and the I/O module are mounted in a corresponding individual chassis. In one embodiment, each of the individual chassis is configured to be stackable together into a single line replaceable unit (LRU). In one embodiment, each of the individual chassis has an identically shaped outer frame. In one embodiment, the plurality individual chassis include a plurality of DC module chassis each having a first chamber configured to mount at least one circuit card assembly (CCA) on a first side of the chassis and a second chamber configured to mount at least one circuit card assembly (CCA) on a second side of the chassis opposite to the first side of the chassis. In one embodiment, each of the plurality of DC converter modules comprises a plurality of CCAs and wherein at least one of the plurality of CCAs is mounted in the first chamber and at least one of the plurality of CCAs is mounted in the second chamber.

In one embodiment, a high voltage bus electrically connecting each of the plurality of DC converter modules, each of the plurality of AC inverter modules and the I/O module, the high voltage bus is configured to deliver a high voltage DC input to the I/O module to each of the plurality of DC converter modules and each of the plurality of AC inverter modules. In one embodiment, a controller area network (CAN) bus electrically connects each of the plurality of DC converter modules, each of the plurality of AC inverter modules and the I/O module. In one embodiment, the CAN bus is configured to deliver control signals from the I/O module to each of the plurality of DC converter modules and each of the plurality of AC inverter modules. In one embodiment, the high voltage bus includes a plurality of individual connectors. In one embodiment, one of the individual connectors is electrically mounted to each of plurality of DC converter modules, each of the plurality of AC inverter modules and the I/O module. In one embodiment, the plurality of individual connectors includes a female end and a male end configured to allow the individual connectors to be connected together in a stack when the individual chassis are stacked together into the single line replaceable unit (LRU).

In one embodiment, a method for providing a power supply is also disclosed.

BRIEF DESCRIPTION OF THE DRAWINGS

Further features as well as the structure and operation of various embodiments are described in detail below with reference to the accompanying drawings. In the drawings, like reference numbers indicate identical or functionally similar elements.

DETAILED DESCRIPTION

Figure 1:
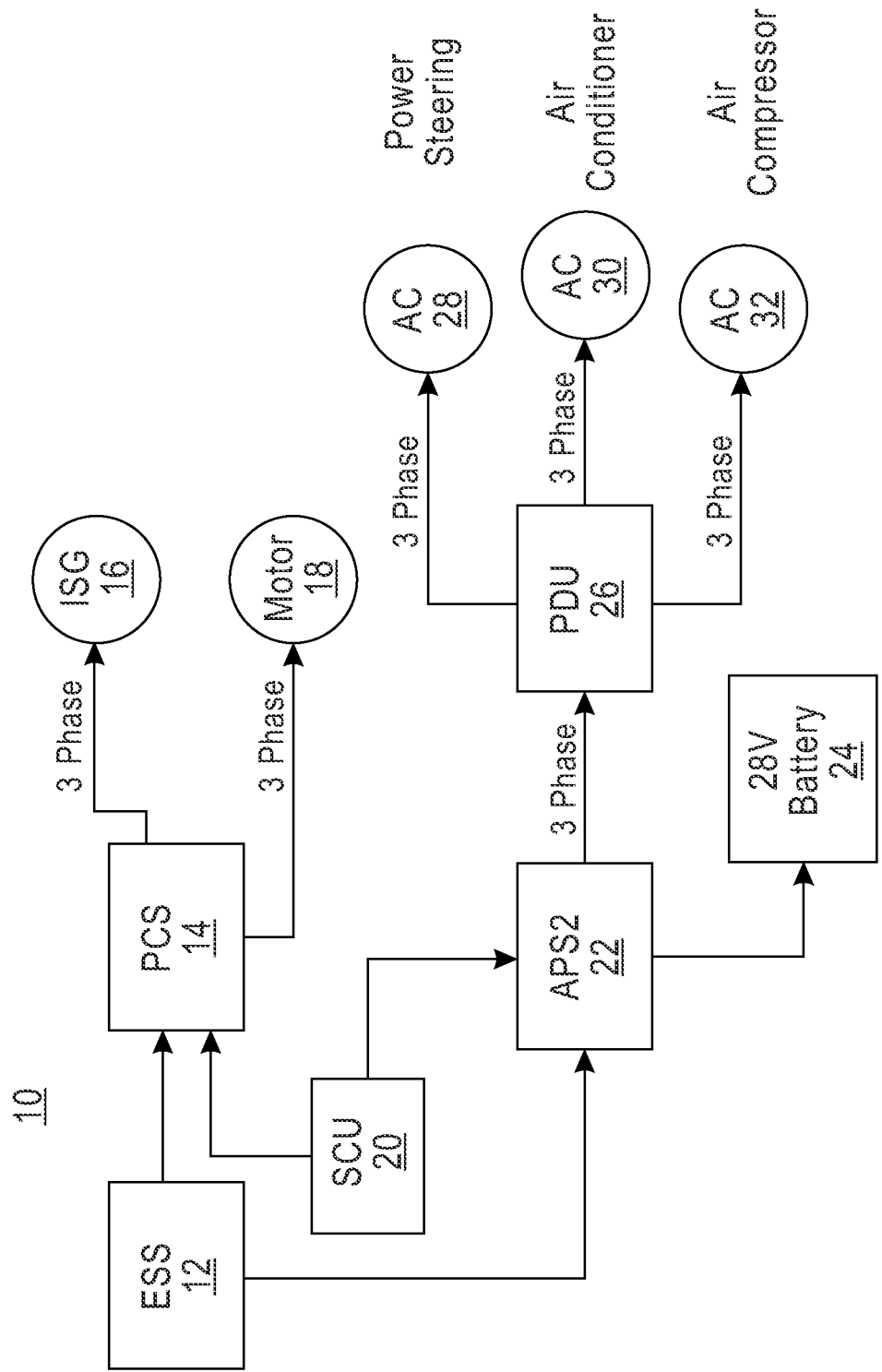
FIG. 1 is a block diagram of a prior art vehicle power management system.
Figure 2:
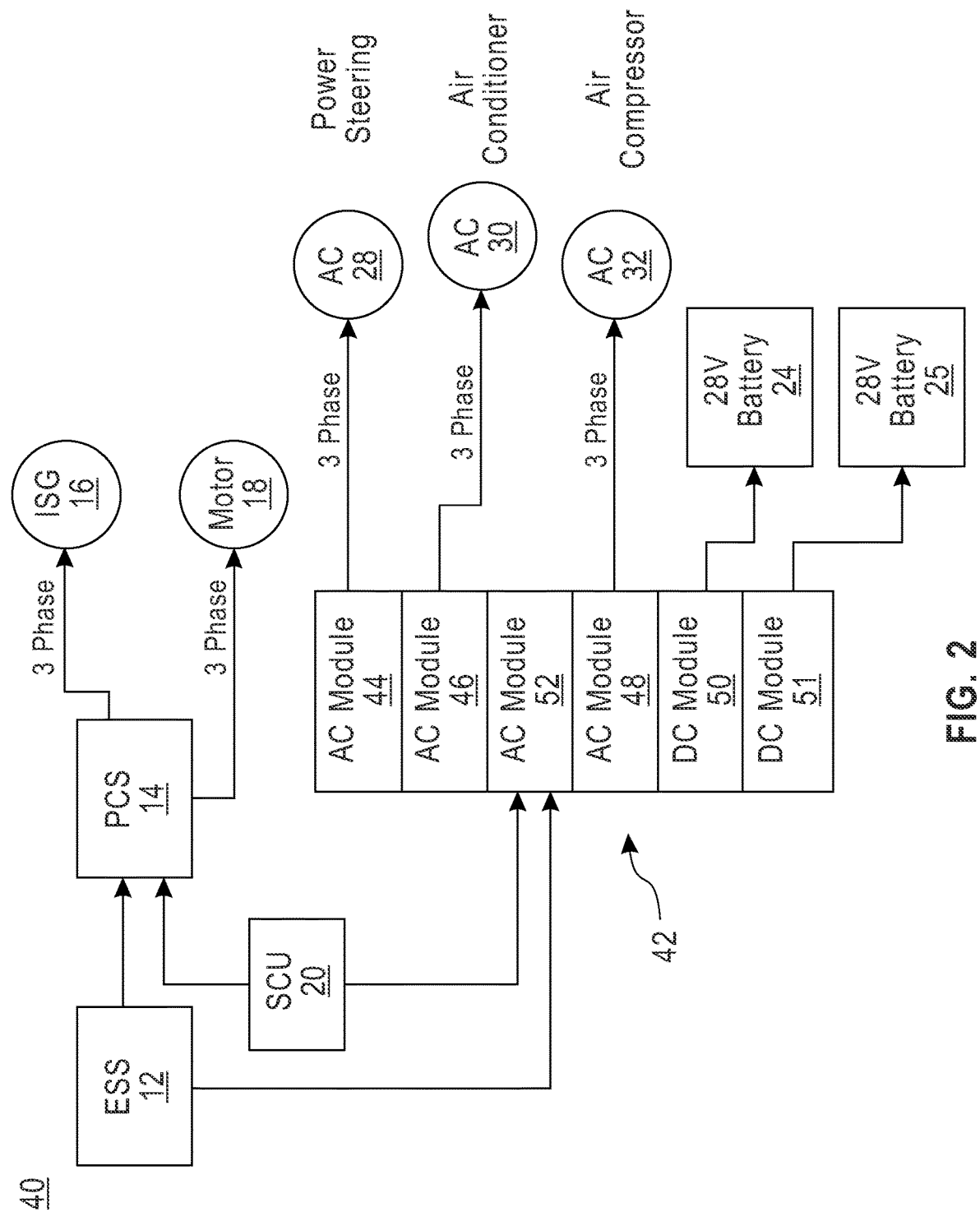
FIG. 2 is a block diagram of one embodiment of modular power supply used in a vehicle power management system.

FIG. 2 is a block diagram of one embodiment of modular power supply as used in a vehicle power management system 40. The vehicle power management system 40 includes energy storage system 12 and propulsion control system 14 which controls integrated starter generator 16 and motor 18. The system control unit 20 controls the propulsion control system 14. However, the accessory power system 22 and the power distribution system 26 of the prior art system of FIG. 1 are replaced by a modular power supply 42. In the embodiment shown in FIG. 2, the modular power supply 42 includes three AC modules 44, 46 and 48 and two DC modules 50 and 51. The modular power supply 42 also includes an I/O module 52. In one embodiment, the individual AC modules of the modular power supply 42 each provide AC power to a separate individual accessory. In the embodiment shown in FIG. 2, AC module 44 provides 3-phase power to power steering accessory unit 28, AC module 46 provides 3-phase power to air conditioner accessory unit 30, and AC module 48 provides 3-phase power to air compressor accessory unit 28. Each DC module 50 and 51 provides DC power to charge a 28 volt battery 24, 25, respectively. The number of AC modules and DC modules may vary depending on the number of the electrical accessories being powered. The modular power supply 42 must include at least one IO module and then at least one other module, AC or DC. For example, to use of modular power supply 42 as an accessory power system for a hybrid electric vehicle, it can mix and match up to eight total outputs using any kind of modules.

The modular power supply 42 improves functionality and flexibility of the prior art vehicle power management system 10. The modular power supply 42 provides scalable power and configurable modules featuring independent AC drives that results in a significant cost-reduction, as well as improved capability and performance in the vehicle power management system 40 as compared to the prior art vehicle power management system shown in FIG. 1. In addition to being used in a power management system for a hybrid electric or electric vehicle, the modular power supply 42 can also be used in many other systems to provide electric capabilities and features. For example, the modular power supply 42 may be used to provide power for conventional transit platforms, electric drives for construction/agricultural platforms as well as other similar platforms and applications. By creating the modular accessory power system, the unit is now able to be right sized. This allows for exactly the right number of outputs needed for the application with the right power level resulting in higher efficiency and removed the need to have a separate PDU on the vehicle.

Figure 3:
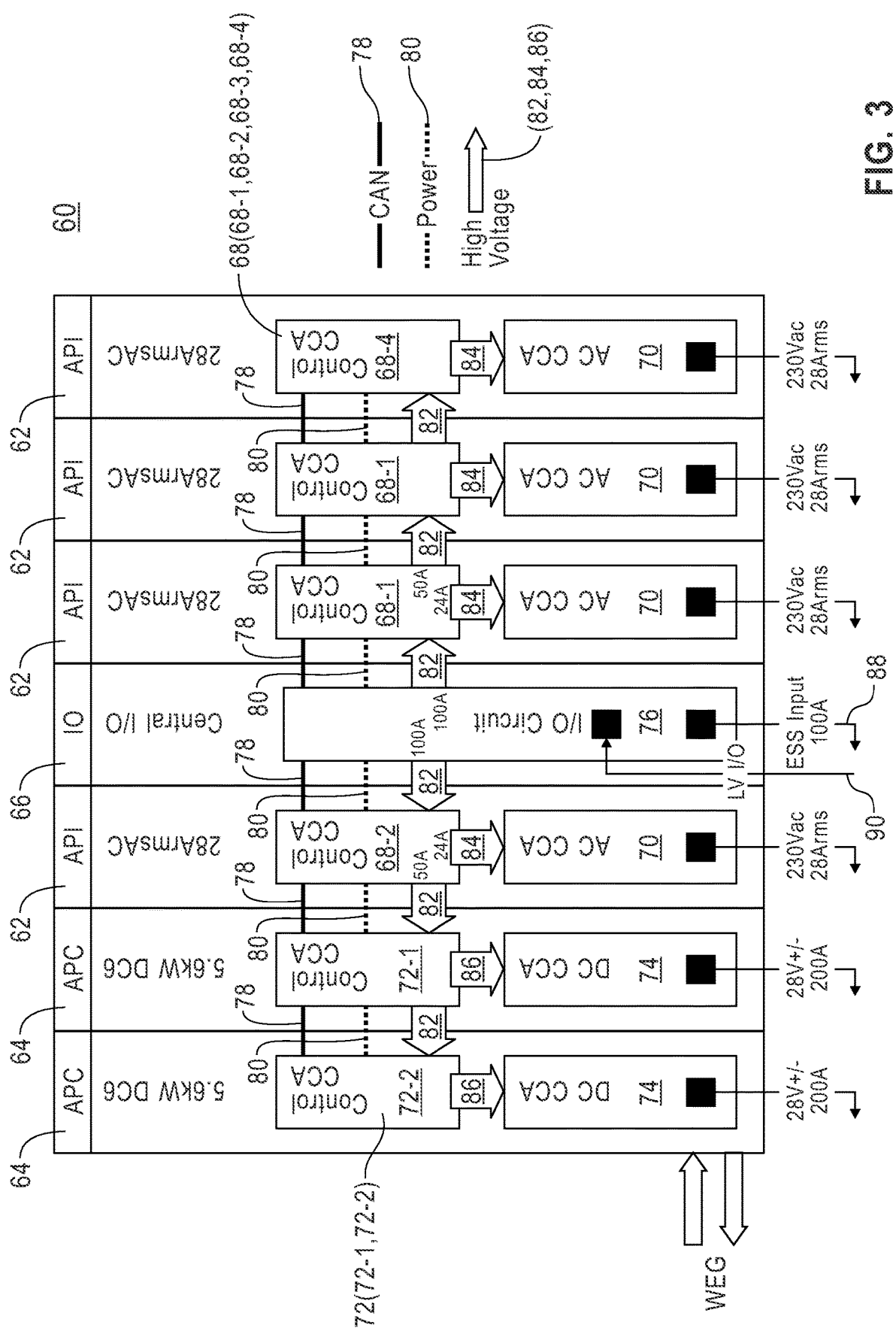
FIG. 3 is a block diagram of one embodiment of a modular power system.

FIG. 3 is a block diagram of one embodiment of a modular power system 60. The modular power system 60 includes four AC modules 62 each configured as an accessory power inverter (API), two DC modules 64 each configured as an accessory power converter (APC) and one central input/output module (I/O) 66. In one embodiment, the modules 62, 64 and 66 contain one or more circuit card assemblies (CCA). Each API module 62 includes a control CCA 68 and an AC Filter CCA 70. Each APC 64 includes a control CCA 72 and a DC converter CCA 74. The I/O module 66 includes an I/O circuit 76 that includes all necessary I/O to power on the unit and communicates with the rest of the system. Control CCAs 68 and 72 have the same components with a small percentage populated with different values. The control CCAs 68, control CCAs 72 and I/O circuit 76 are connected together by a controller area network (CAN) 78 which is a standard communication protocol used in vehicles, by a power cable 80 and by a high voltage backbone 82. The control CCAs 68 are connected to the AC CCAs 70 using a high voltage connection 84. The control CCAs 72 are connected to the DC CCAs 74 using a high voltage connection 86. In one embodiment, the CAN 78 extends from the I/O module 66 to each of the plurality of DC converter modules 64 and each of the plurality of AC inverter modules 62.

The I/O circuit 76 receives a high voltage input 88 of 500V-800V dc at a maximum current of 100 A from the ESS 12. The I/O circuit 76 also receives a low voltage input 90 from a battery. The I/O circuitry 76 has all the inputs for power and communication. The I/O circuit 76 distributes the high voltage to each of the CCAs 68 and 72 using the high voltage backbone 82. I/O circuit 76 transfers through the bus 82 a current of up to 100 A to the two control CCAs 68-1 and 68-2 that are located in a module position adjacent to the I/O circuit 76. Up to 50 A is transferred to control CCA 68-3, CCA 68-3, CCA 68-4, CCA 72-1 and CCA 72-2 through the bus 82. Each API control CCA takes 22.5 A and each APC control CCA takes 11.2 A. Each control CCA 68 transfers the high voltage at 25 A to each of the AC CCAs 70 through high voltage buses 84. Each control CCA 72 transfers 25 A to each DC CCA 74 through high voltage buses 84. Each AC CCA 70 outputs 230 Vac and 28 Arms. Each DC CCA 74 includes a low voltage output in the range of 9 Vdc to 36 Vdc. In one embodiment the low voltage output is 28 Vdc, 200 Adc at 5.6 kW DC.

Figure 4:
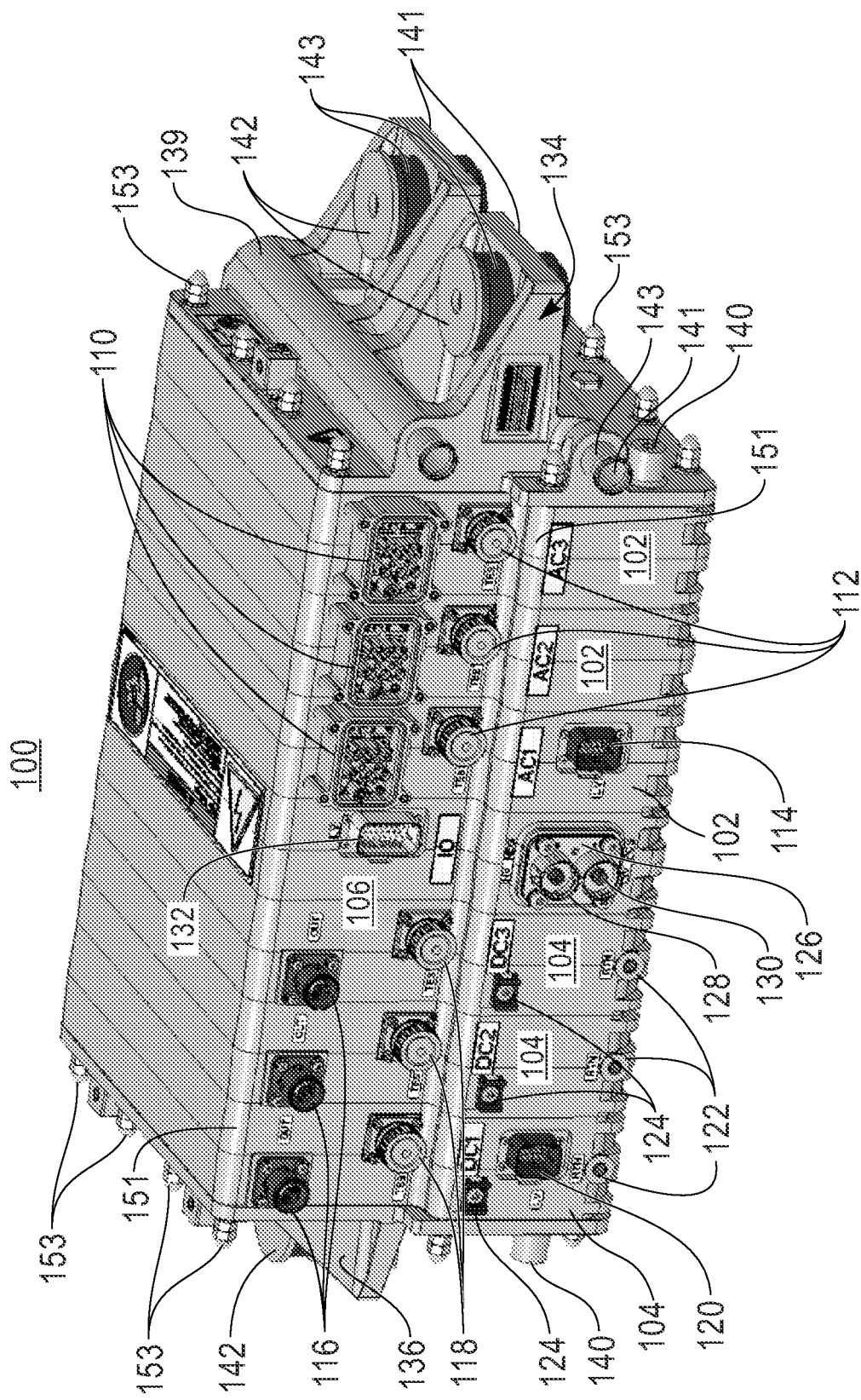
FIG. 4 is a perspective view of one embodiment of a modular power supply configurable as a line replaceable unit.

In one embodiment, as shown in FIG. 4, a modular power supply is a configurable line replaceable unit (LRU) 100. The LRU 100 consists of the AC modules 102, DC modules 104 and an I/O module 106 stacked together and electrically connected together. The LRU 100 shown in FIG. 4 has three AC modules 102, three DC modules 104 and one I/O module 106.

In one embodiment, each of the AC modules 102 includes a high voltage motor connector 110 to output 230 Vrms to 480 Vrms at 28 Arms. Each AC module 102 also includes a fiber optic test connector 112. In one embodiment, one of the AC modules 102 includes a low voltage connector 114 for permanent magnet motor sensors, such as temperature and rotor-position.

In one embodiment, each of the DC modules 104 includes a low voltage connector 116 to output 28 Vdc at 200 Adc. Each DC module 104 also includes a fiber optic test connector 118. In one embodiment, one of the DC modules 104 includes a low voltage connector 120 for starting, lighting and ignition (SLI) battery voltage, current and temperature. Each DC module 104 also includes a 28 Vdc return connection 122. Each DC module 104 may have a low voltage DC power plug 124 with strain relief. In one embodiment, the I/O module 106 includes a high voltage DC connector 126 which may input 500-800 Vdc. In one embodiment, the high voltage DC connector 126 includes a negative connector 128 and a positive connector 130. The I/O module 106 may include a low voltage connector 132 for connecting the CAN bus, ignition and SLI power.

The LRU unit 100 includes right side end cap 134 and a left side end cap 136. In one embodiment, the right side end cap 134 includes an inlet coolant port 138 for an internal coolant channel 139 and an outlet coolant port 141 for an outlet coolant channel 143. Safety ground connections 140 are provided on each end cap 134 and 136. In one embodiment, right side end cap 134 has two isolators 142 and left side end cap has one isolator 142. Right side end cap 134 has two ledge portions 141 with through holes 143 to accommodate the isolators 142.

Figure 5:
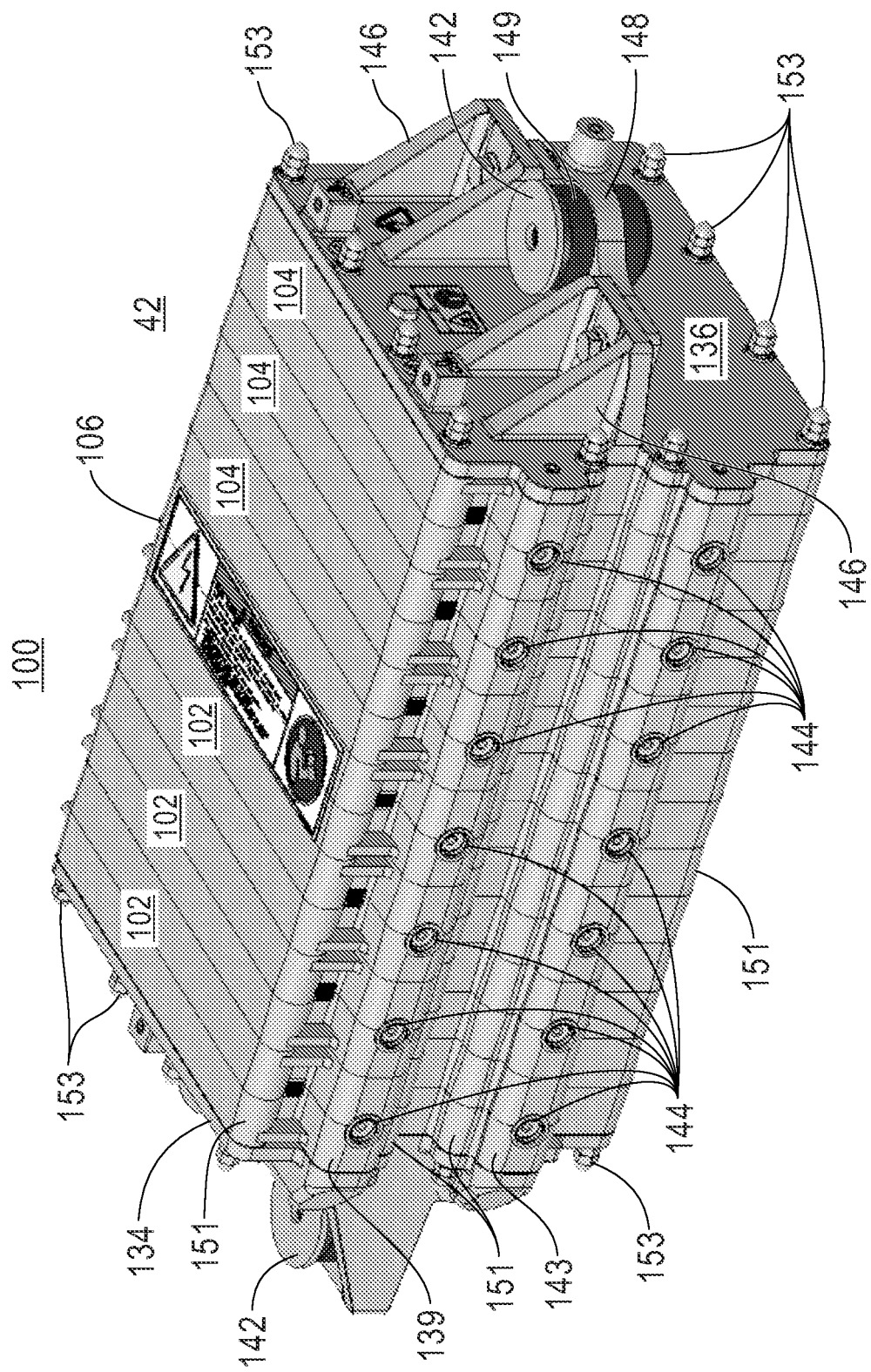
FIG. 5 is a perspective view of one embodiment of a modular power supply configurable as a line replaceable unit.

As shown in FIG. 5, the coolant channels 139 and 143 extend around to the back side of the modular power system 42. Each of the AC modules 102, DC modules 104 and the I/O module 106 includes a port 144 in fluid communication with the coolant channels 139 and 143. The left side end cap 136 includes a pair of ledges 146 that extend outward. A bracket 148 is secured to the ledges 146. The Bracket 148 has a through hole 149 to accommodate an isolator 142.

The chassis' for each of the modules 102, 104 and 106 are configured to be stackable together to form the modular accessory power supply LRU 100. The modules 102, 104 and 106 are held together by a series of bolts (not shown) that extend through a series of passages 151. The bolts are secured by nuts 153.

Figure 6A:
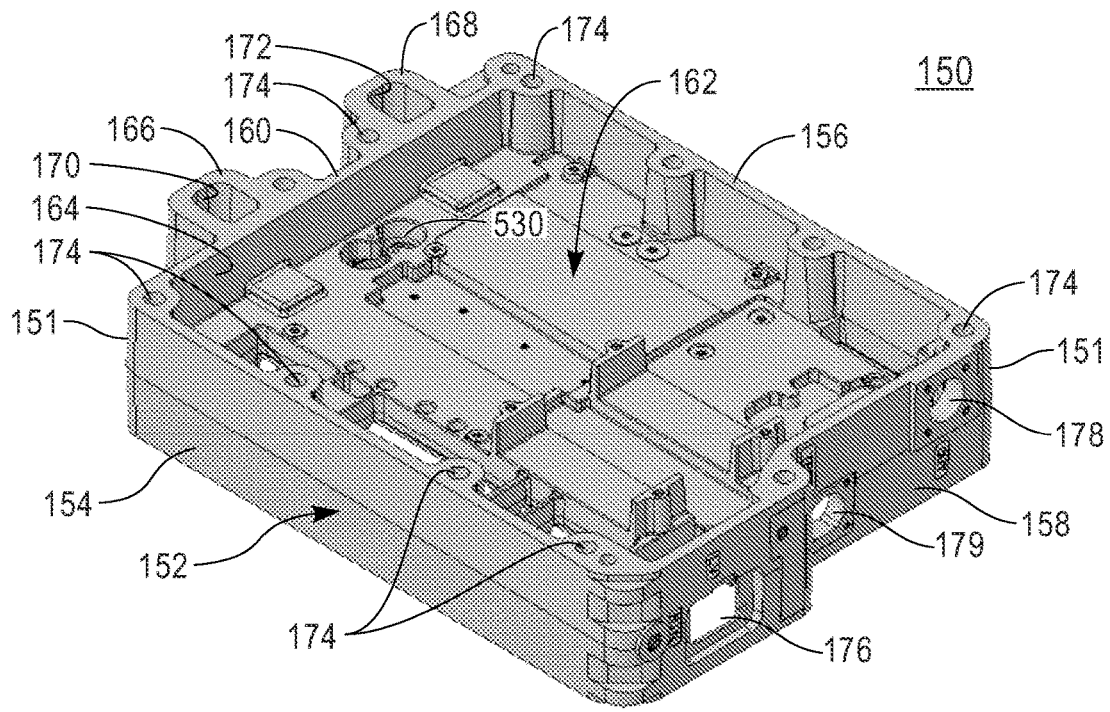
FIG. 6A is a perspective view of one embodiment of a chassis of a DC module.
Figure 6B:
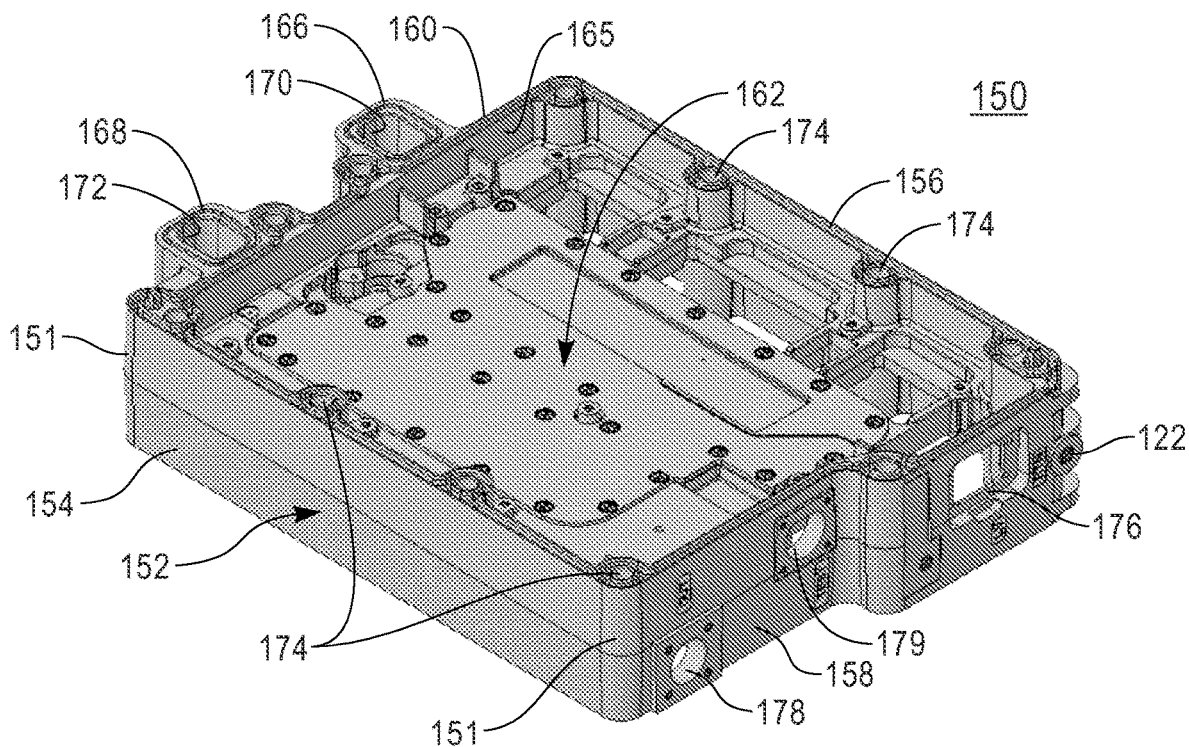
FIG. 6B is a perspective view of one embodiment of a chassis of a DC module.

FIGS. 6A and 6B are perspective views of a chassis 150 of DC module 104. The chassis 150 has an outer wall 152 that includes a bottom wall 154, a top wall 156, a front side wall 158 and a rear side wall 160. The shape of the outer wall 152 is configured to accommodate the CCAs and electrical components of the accessory power converter of the DC module 104 and is not limited to the shape shown in FIGS. 6A and 6B. The chassis 150 has a central platform 162 that divides the chassis 150 into two chambers 164 and 165 on opposite sides of the platform 162.

Extending from rear wall 160, are a pair of protruding parts 166 and 168. Protruding part 166 includes a passage 170. The passage 170 forms a portion of the coolant channel 143 when the modules are assembled into LRU 100. Protruding part 168 includes a passage 172. The passage 172 forms a portion of the coolant channel 139 when the modules are assembled into LRU 100. The chassis 150 includes a series of through holes 174 that extend through the outer wall 152. The through holes 174 form passages 151 to accommodate the bolts for holding the modules together when the modules are assembled into LRU 100. The front side wall 158 of the DC module chassis 150 has an opening 176 to accommodate the GR low voltage connector 120. As noted above in connection with FIG. 4, in one embodiment, one of the DC modules 104 includes a low voltage connector 120 for starting, lighting and ignition (SLI) battery voltage, current and temperature. The module 104 with connector 120 has the ability to read voltage, temperature and current of the vehicle SLI. The module 104 with connector 114 has inputs for a permanent magnet machine such as motor position sense and temperature The chassis for the other DC modules 104 do not have the opening 176. The front side wall 158 of the module chassis 150 shown in FIG. 6A also has an opening 178 and an opening 179. The opening 178 accommodates the low voltage connector 116 and the opening 179 accommodates the fiber optic test connector 118.

Figure 6C:
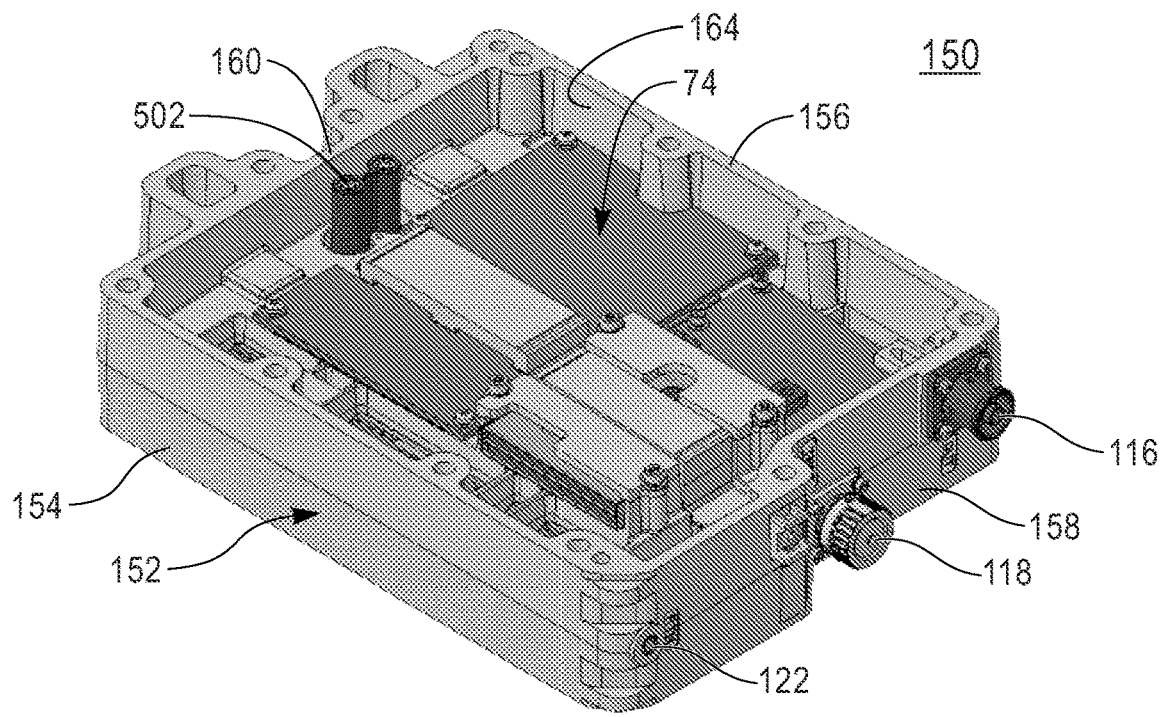
FIG. 6C is a perspective view of one embodiment of a chassis of a DC module.
Figure 6D:
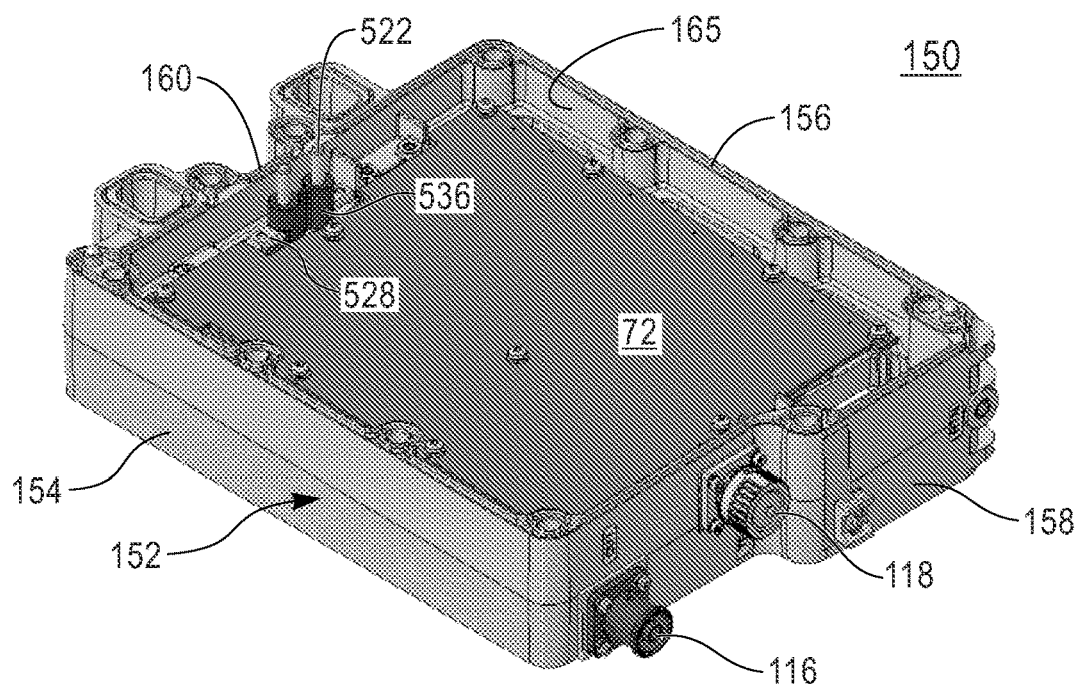
FIG. 6D is a perspective view of one embodiment of a chassis of a DC module.

The DC module chassis 150 has one or more circuit boards and various electrical components mounted within each of the chambers 164 and 165. In one embodiment, the topography of the surface of the central platform 162 facing each chamber 164 and 165, respectively, is configured to accommodate the CCAs and electrical components of the accessory power converter 64 of FIG. 3. In one embodiment, as shown in FIG. 6C, the DC CCA 74 is mounted in chamber 164. CCA 74 as shown in FIG. 6C is made of several circuit boards and electrical and electronic components. In one embodiment, as shown in FIG. 6D, the control CCA 72 is mounted in chamber 165. The circuit boards and components of control CCA 72 are not shown to simplify the drawings.

Figure 7A:
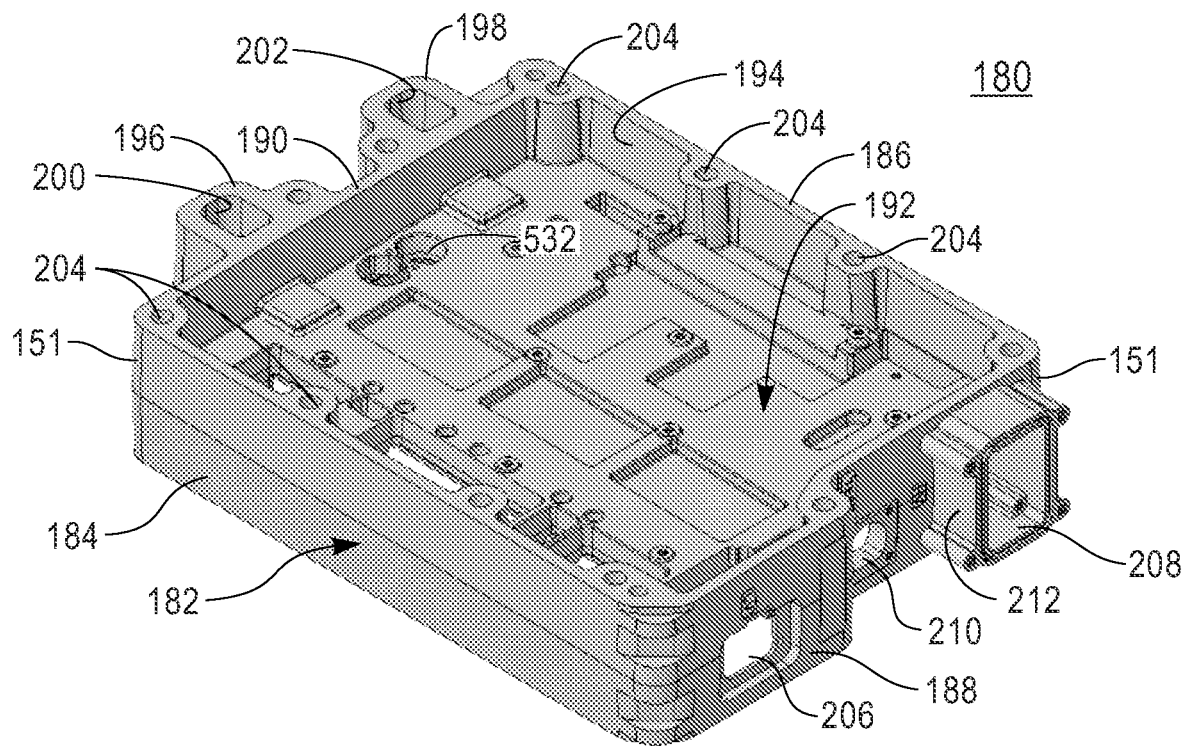
FIG. 7A is a perspective view of one embodiment of a chassis of an AC module.
Figure 7B:
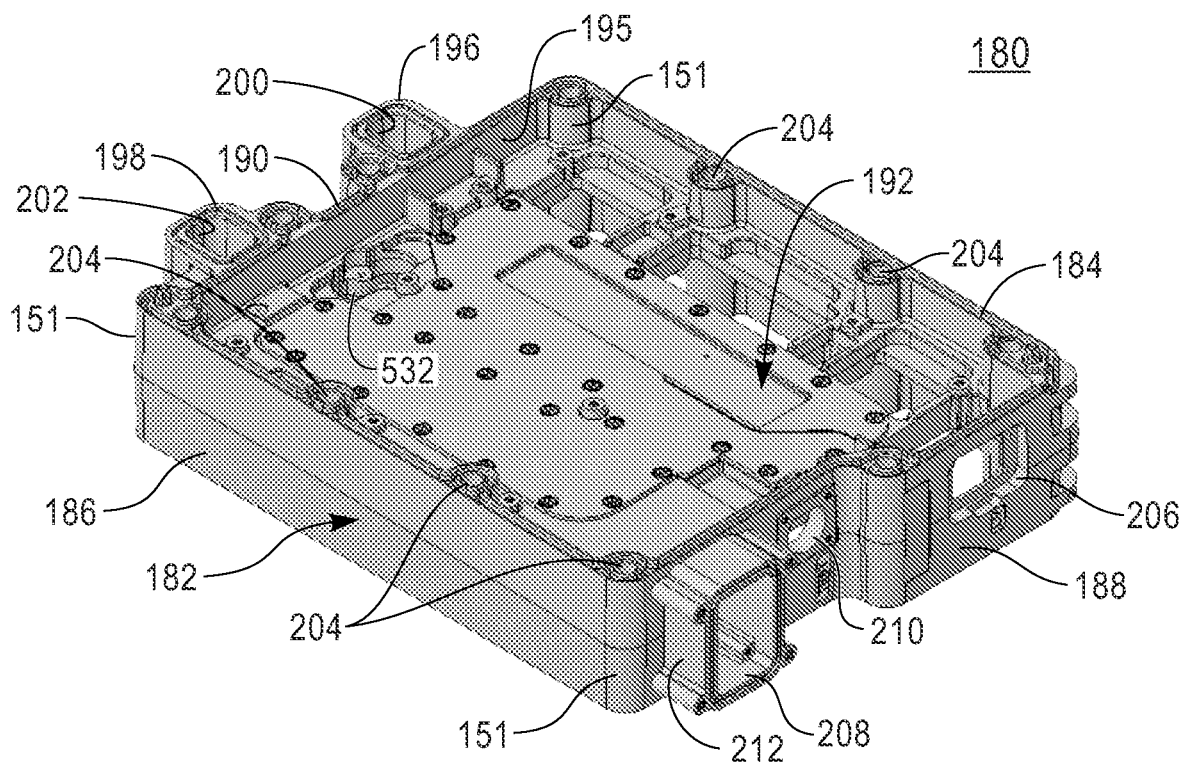
FIG. 7B is a perspective view of one embodiment of a chassis of an AC module.

FIGS. 7A and 7B are perspective views of a chassis 180 of AC module 102. The chassis 180 has an outer wall 182 that includes a bottom wall 184, a top wall 186, a front side wall 188 and a rear side wall 190. The shape of the outer wall 182 is identical to the shape of the outer wall 152 of the DC chassis 150 and is also configured to accommodate the CCAs and electrical components of the accessory power inverter of the AC module 102. As noted above, the shape of the outer walls 152 and 182 is not limited to the shape shown in FIGS. 6A, 6B, 7A and 7B. The chassis 180 has a central platform 192 that divides the chassis 180 into two chambers 194 and 195 on opposite sides of the platform 192. Extending from rear wall 190, are a pair of protruding parts 196 and 198. Protruding part 196 includes a passage 200. The passage 200 forms a portion of the coolant channel 143 when the modules are assembled into LRU 100. Protruding part 198 includes a passage 202. The passage 202 forms a portion of the coolant channel 139 when the modules are assembled into LRU 100. The chassis 180 includes a series of through holes 204 that extend through the outer wall 182. The through holes 204 form passages 151 to accommodate the bolts for holding the modules together when the modules are assembled into LRU 100. The front side wall 188 of the AC module chassis 180 has an opening 206 to accommodate the BL low voltage connector 114. As noted above in connection with FIG. 4, in one embodiment, one of the AC modules 102 includes a BL low voltage connector 114 for permanent magnet motor sensors, such as temperature and rotor-position. The chassis for the other AC modules 102 do not have the opening 206. The front side wall 188 of the AC module chassis 180 also has an opening 208 and an opening 210. The opening 208 includes a frame 212 extending from the front side wall 188 that accommodates the high voltage motor connector 110 and the opening 210 accommodates the fiber optic test connector 112.

Figure 7C:
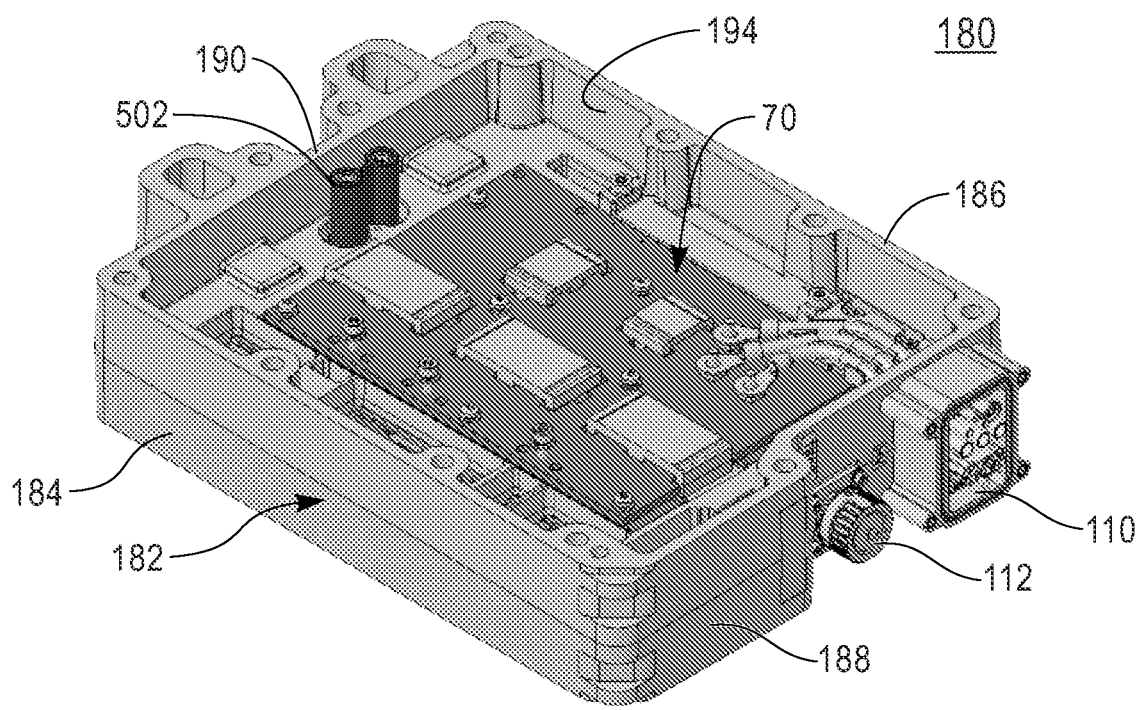
FIG. 7C is a perspective view of one embodiment of a chassis of an AC module.
Figure 7D:
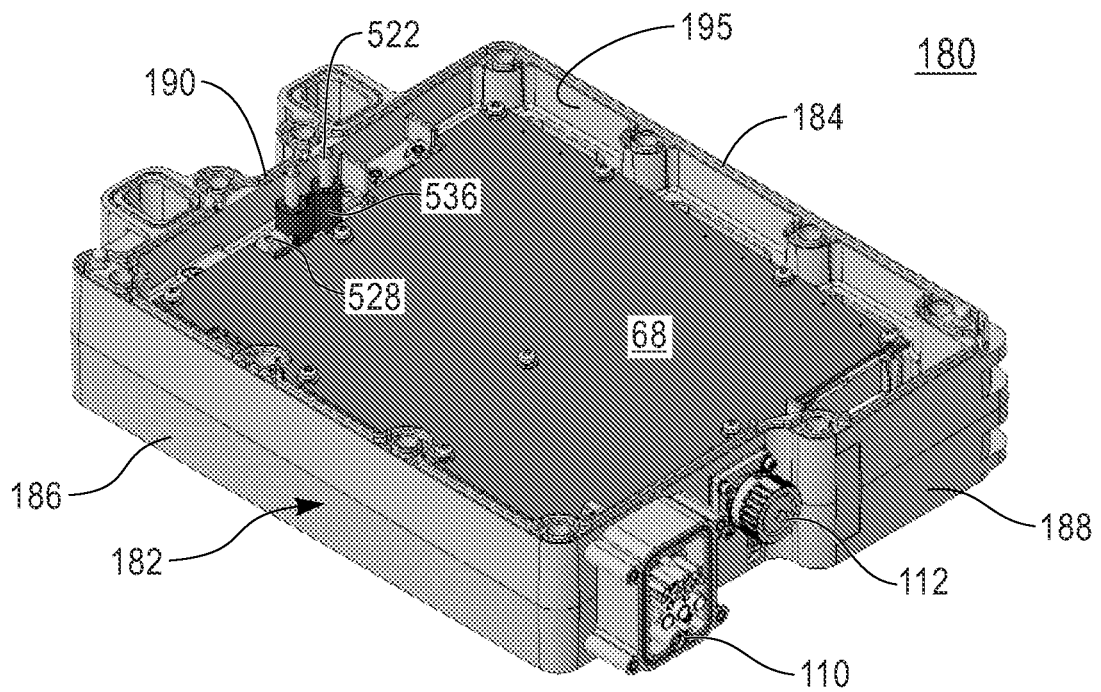
FIG. 7D is a perspective view of one embodiment of a chassis of an AC module.

The AC module chassis 180 has one or more CCAs and various electrical components mounted within each of the chambers 194 and 195. In one embodiment, the topography of the surface of the central platform 192 facing each chamber 194 and 195, respectively, is configured to accommodate the CCAs and electrical components of the accessory power inverter 62 of FIG. 3. In one embodiment, as shown in FIG. 7C, the AC CCA 70 is mounted in chamber 194. CCA 70 as shown in FIG. 7C is made of several circuit boards and electrical and electronic components. In one embodiment, as shown in FIG. 7D, the control CCA 68 is mounted in chamber 195. The circuit boards and components of control CCA 68 are not shown to simplify the drawings.

Figure 8A:
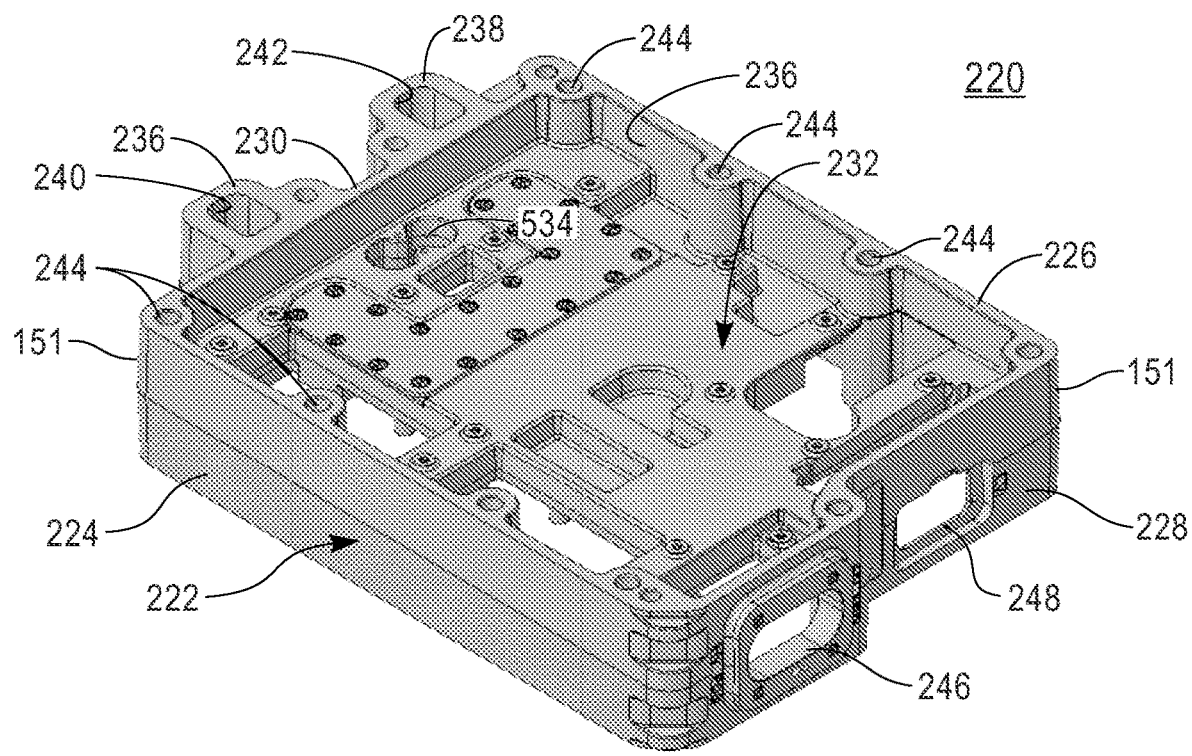
FIG. 8A is a perspective view of one embodiment of a chassis of an I/O module.
Figure 8B:
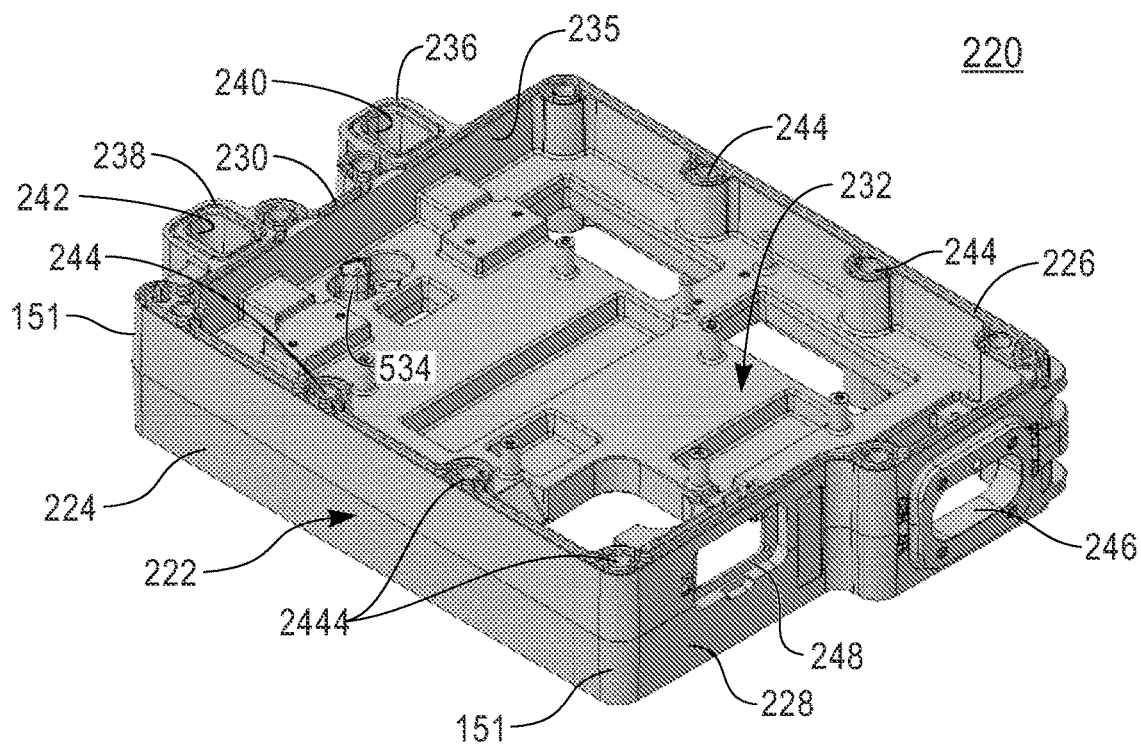
FIG. 8B is a perspective view of one embodiment of a chassis of an I/O module.

FIGS. 8A and 8B are perspective views of a chassis 220 of I/O module 106. The chassis 220 has an outer wall 222 that includes a bottom wall 224, a top wall 226, a front side wall 228 and a rear side wall 230. The shape of the outer wall 222 is identical to the shape of outer wall 152 of the DC chassis 150 and the shape of outer wall 182 of the AC chassis 180 and is also configured to accommodate the circuit boards and electrical components of the I/O board of the I/O module 106. As noted above, the shape of the outer walls 152, 182 and 222 is not limited to the shape shown in FIGS. 6A, 6B, 7A, 7B, 8A and 8B. The chassis 220 has a central platform 232 that divides the chassis 220 into two chambers 234 and 235 on opposite sides of the platform 232. Extending from rear wall 230, are a pair of protruding parts 236 and 238. Protruding part 236 includes a passage 240. The passage 240 forms a portion of the coolant channel 143 when the modules are assembled into LRU 100. Protruding part 238 includes a passage 242. The passage 242 forms a portion of the coolant channel 139 when the modules are assembled into LRU 100. The chassis 220 includes a series of through holes 244 that extend through the outer wall 222. The through holes 244 form passages 151 to accommodate the bolts for holding the modules together when the modules are assembled into LRU 100. The front side wall 228 of the I/O module chassis 220 has an opening 246 to accommodate the high voltage DC connector 126. The front side wall 228 of the I/O module chassis 200 also has an opening 248. The opening 248 accommodates the WH-type low voltage connector 132 for connecting the CAN bus, ignition and SLI power.

Figure 8C:
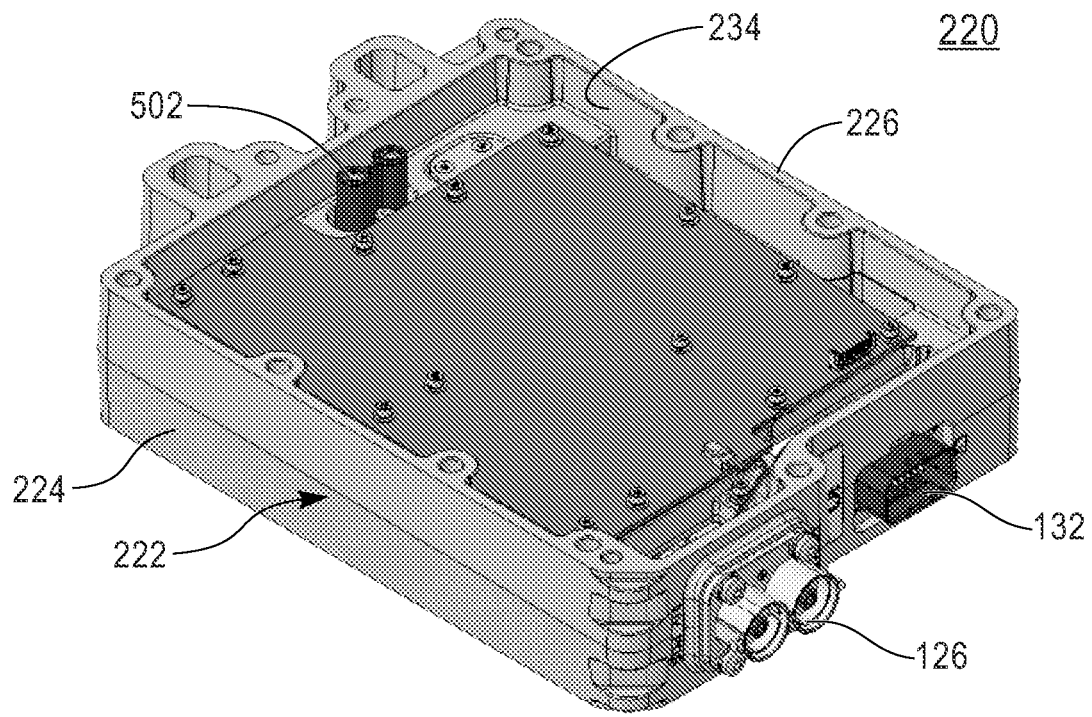
FIG. 8C is a perspective view of one embodiment of a chassis of an I/O module.
Figure 8D:
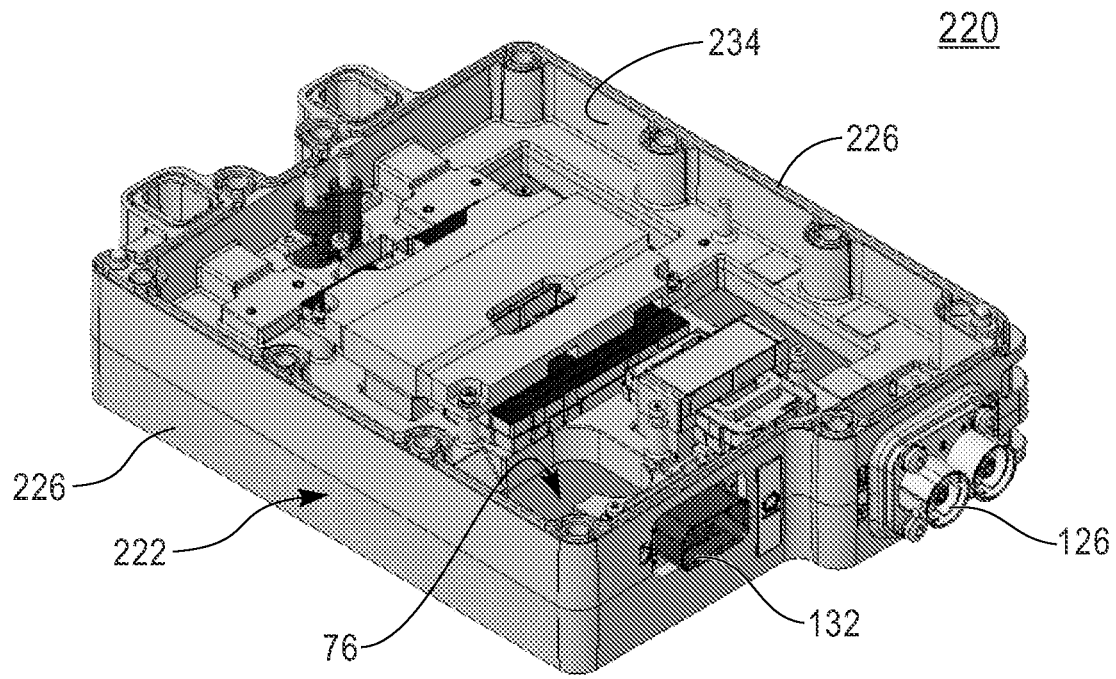
FIG. 8D is a perspective view of one embodiment of a chassis of an I/O module.

The I/O module chassis 220 has one or more CCAs and various electrical components mounted within each of the chambers 234 and 235. In one embodiment, the topography of the surface of the central platform 232 facing each chamber 234 and 235, respectively, is configured to accommodate the CCAs and electrical components of the central I/O module 66 of FIG. 3. In one embodiment, as shown in FIGS. 8C and 8D, a portion of the I/O circuit 76 is mounted in chamber 234 and a portion of the I/O circuit 76 is mounted in chamber 235. The portion of I/O circuit 76 as shown in FIG. 7D is made of several circuit boards and electrical and electronic components. The circuit boards and components of the portion of I/O circuit 76 in chamber 235 are not shown to simplify the drawings.

Figure 9:
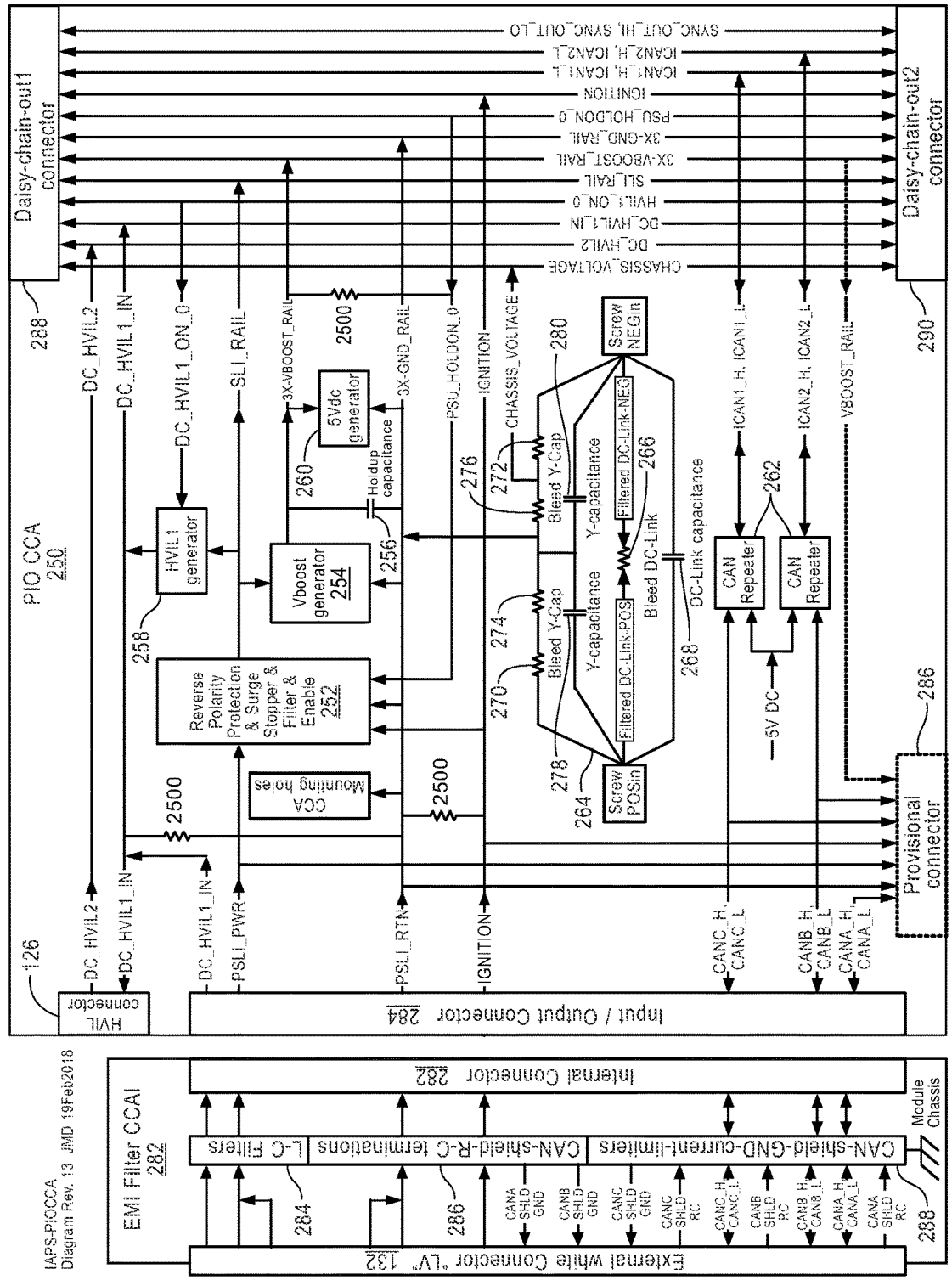
FIG. 9 is a circuit diagram of one embodiment of I/O circuit of an I/O module.

FIG. 9 is a circuit diagram of one embodiment of I/O circuit 76 of I/O module 66/106. The I/O circuit 76 includes a main I/O circuit 250. The main I/O circuit 250 includes a Reverse Polarity protection and surge stopper circuit 252 that provides protection for SLI voltage surges/transients. A Vboost generator 254 powers downstream low voltage control electronics and may support up to 10 Modules (100-150 W total). A Holdup Capacitance 256 is provided on the Vboost generator 254 output. A High Voltage Interlock (HVIL) generator 258 and a 5 Vdc generator 260 are provided on a HV DC link connector 126 of the I/O module 106. The main I/O circuit 250 includes two CAN repeaters 262. The main I/O circuit 250 includes a HV link damper circuit 264 that includes DC link bleed resistor 266, DC link common mode capacitor 268, bleed resistors 270, 272, Y-capacitance resistors 274, 276 and differential mode Y-capacitors 278, 280. The HV link damper circuit 264 protects the modular power system 42/60/100 from DC link ripple content. In one embodiment, the bleed resistors 266, 270, 272 discharge the HV capacitance to a safe level in 3 minutes or less. The I/O main circuit 250 in one embodiment has a DC link input voltage range of 500V-800 Vdc, maximum input power of 50 kW and maximum input current of 100 Adc. The I/O main circuit 250 may also be designed for SLI Starting/Cranking/Low Voltage Input.

I/O circuit 76/106 in one embodiment also includes an EMI filter circuit 282. The EMI filter circuit 282 includes a plurality of LC filters 284, CAN shield RC terminations 286 and GND current limiters 288. In one embodiment, the main circuit board 250 is located in the chamber 234 of I/O chassis 220 and the EMI filter circuit 282 is located in the chamber 235 of the I/O chassis 220. The low voltage connector 132 of the I/O module 76/106 is connected to the EMI filter circuit 282. The high voltage connector 126 of the I/O module 76/106 is connected to the main circuit 250. Internal connector 282 connects the EMI filter circuit to the DC and AC modules in the LRU 100. Main circuit 250 includes input/output connector 284, provisional; connector 286 daisy-chain out 1 connector 288 and daisy-chain out 2 connector 290. The daisy-chain connectors 288 and 290 provide module to module connections in the LRU 100

Figure 10:
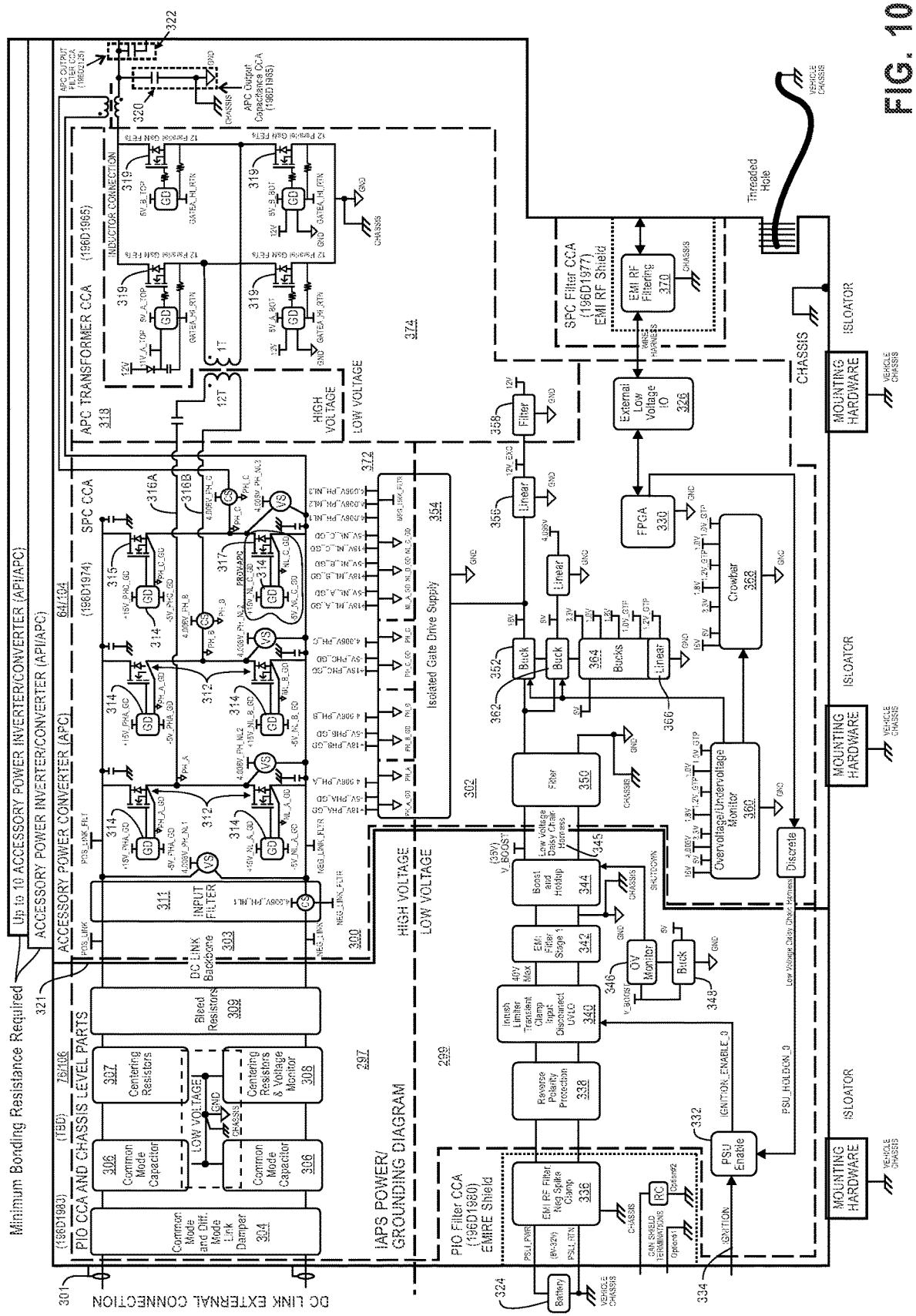
FIG. 10 is a circuit diagram one embodiment of a control CCA and DC CCA of an APC module combined with a portion of an I/O module.

FIG. 10 is a circuit diagram one embodiment of the control CCA 72 and DC CCA 74 of APC module 64/104 combined with a portion of the I/O module 76/106. The circuits on APC module 64/104 are shown on the right side of the solid 321. The circuits on the I/O module 76/106 are shown on the left side of solid line 321. In one embodiment, the DC link input voltage to the I/O module 76/106 range is 500V-800 Vdc, the output voltage typical regulation is 27.5 Vdc/13.8 Vdc+/−0.4 Vdc, the maximum output current is 200 Adc at 27.5 Vdc/13.8 Vdc and the maximum output power is 5.5 kW. In one embodiment, the efficiency may be greater than 90% and can be greater than 95%. In one embodiment, the maximum coolant temperature is 65° C. and the maximum ambient temperature is 85° C.

The APC circuit 64/104 has a high voltage section 300 forming DC CCA 74 and a low voltage section 302 forming control CCA 72. The I/O module 76/106 has a high voltage section 297 and a low voltage section 299. The high voltage section 299 includes a link damper 304, a pair of common mode capacitors 306 connected in series, a voltage monitor 308 and centering resistors 307 connected in series and bleed resistors 309, connected in parallel. The high voltage DC link external connection 301 inputs 500V-800V DC. The high voltage section 297 of I/O module 76/106 is connected to the high voltage section 300 of DC module 64/104 through the high voltage backbone 303. An input filter circuit 311 is connected between the bleed resistors 309 and a high voltage power converter switch circuit 310. The high voltage power converter switch circuit 310 includes multiple sets of series connected FETs 312. Two sets of series connected FETS 312 are shown for one embodiment of a modular power accessory unit. The FET 315 is used for flyback and boost mode and the FET 317 is not populated. Each FET 312, 315 and 317 has an isolated gate drive circuit 314. The switch circuit 310 converts the DC input voltage to 2-phases output 316A and 316B. The two phase output 316A and 316B are input to low voltage transformer circuit 318 which outputs 28 Vdc, 200 A at 5.5 kW through output circuit 320 and EMI filter circuit 322. Low voltage circuit 318 depicts four FETs 319. In one embodiment, each FET 319 is actually made up of a plurality of FETs paralleled together to make the required current rating. In one embodiment, twelve PETS are paralleled together to make the required current rating for the circuit shown in FIG. 10.

The low voltage section 299 of I/O module 76/106 includes low voltage input from battery 324 and external I/O for motor control connection 326. The low voltage section 302 of DC module 64/104 includes a controller 330 that may be a processor or an FPGA with all the program instructions and other intelligence to control the operation of the switches, circuits and components on the CCA 64/104. FPGA 330 controls the PSU enable circuit 332 on I/O module 76/106 that receives an ignition input 334. The low voltage section 299 includes an EMI RF filter negative spike clamp circuit 336, a reverse polarity protection circuit 338, an inrush limiter transient clamp 340, an EMI filter stage 1 circuit 342 and a boost and holdup circuit 344. An overvoltage monitor 346, which is connected to a buck circuit 348, sends a shutdown signal to the boost and holdup circuit 344. The low voltage signal from the boost and holdup circuit 344 is input to a filter circuit 350 on the DC module 64/104 through a low voltage daisy chain harness 345. One of the outputs of filter circuit 350 is input through a buck circuit 352 to an isolated gate drive supply circuit 354, which provides gate drive signals for the gate drive circuits 314. The output from buck circuit 352 is input to linear circuit 356 and the output of linear circuit 356 is input to filter 358 which outputs 12 Vdc. An overvoltage/undervoltage monitor 360 is connected to buck circuit 352, buck circuit 362, buck circuit 364 with linear circuit 366 and to crowbar circuit 368. FPGA 330 provides external low voltage I/O 326 which outputs the low voltage through EMI RF filtering circuit 370. In one embodiment, the CCAs and components in section 372 are located in chamber 74 of FIG. 6C and the CCAs and components in section 374 are located in chamber 72 of FIG. 6D.

Figure 11:
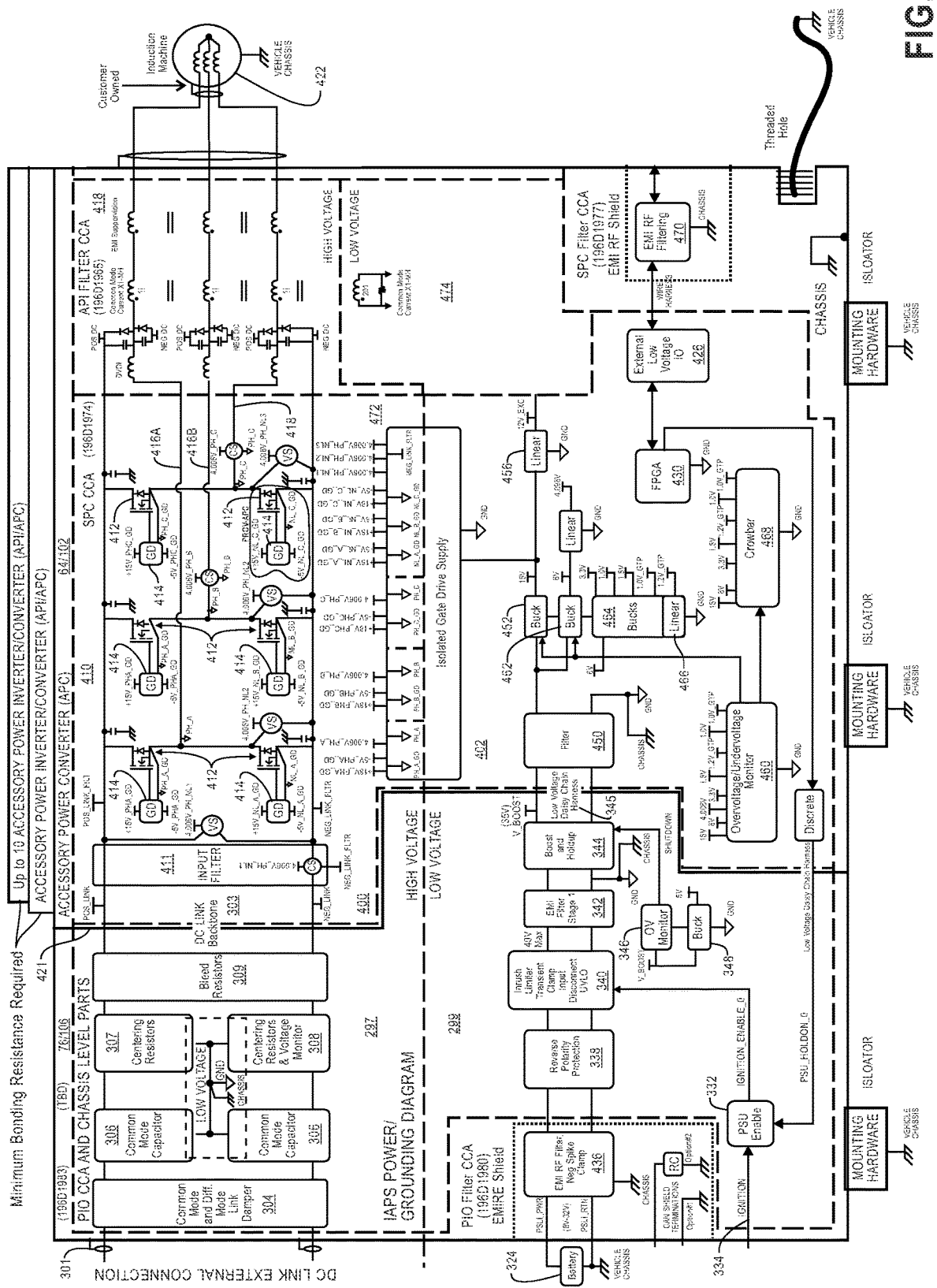
FIG. 11 is a circuit diagram one embodiment of control CCA and an AC CCA API module combined with a portion of an I/O module.

FIG. 11 is a circuit diagram one embodiment of control CCA 68 and AC CCA 70 API module 62/102 combined with a portion of the I/O module 76/106. The circuits on API module 62/102 are shown on the right side of the solid line 421. The circuits on the I/O module 76/106 are shown on the left side of solid line 421. The components of I/O module 76/106 are the same as shown in FIG. 10 and will not be repeated. The APC circuit 62/102 has a high voltage section 400 forming DC CCA 74 and a low voltage section 402 forming control CCA 72. The high voltage section 297 of I/O module 76/106 is connected to the high voltage section 400 of AC module 62/102 through the high voltage backbone 303. An input filter circuit 411 is connected between the bleed resistors 309 and a power converter switch circuit 410. The high voltage power converter switch circuit 410 includes multiple sets of series connected FETs 412. Three sets of series connected FETS 412 are shown for convenience but the actual number will depend on the voltage requirements of the LRU 100. Each PET 412 has an isolated gate drive circuit 414. The switch circuit 410 converts the DC input voltage to 3-phase output 416A, 416B and 416C. The three phase output 416A, 416B and 416C are input filter circuit 418 which provides 200 Vrms to 400 Vrms output 322 for powering a vehicle accessory.

The low voltage section 402 includes a controller 430 that may be a processor or an FPGA with all the program instructions and other intelligence to control the operation of the switches, circuits and components on the CCA 64/104. FPGA 430 controls the PSU enable circuit 332. The low voltage signal from the boost and holdup circuit 344 is input to a filter circuit 450 on the AC module 62/102 through a low voltage daisy chain harness 345. One of the outputs of filter circuit 450 is input through a buck circuit 452 to an isolated gate drive supply circuit 454, which provides gate drive signals for the gate drive circuits 414. The output from buck circuit 452 is input to linear circuit 456 and the output of linear circuit 456 is input to filter 458 which outputs 12 Vdc. An overvoltage/undervoltage monitor 460 is connected to buck circuit 452, buck circuit 462, buck circuit 464 with linear circuit 466 and to crowbar circuit 468. FPGA 430 provides external low voltage I/O 426 which outputs the low voltage through EMI RF filtering circuit 470. In one embodiment, the CCAs and components in section 472 are located in chamber 70 of FIG. 7C and the CCAs and components in section 474 are located in chamber 68 of FIG. 7D.

Figure 12:
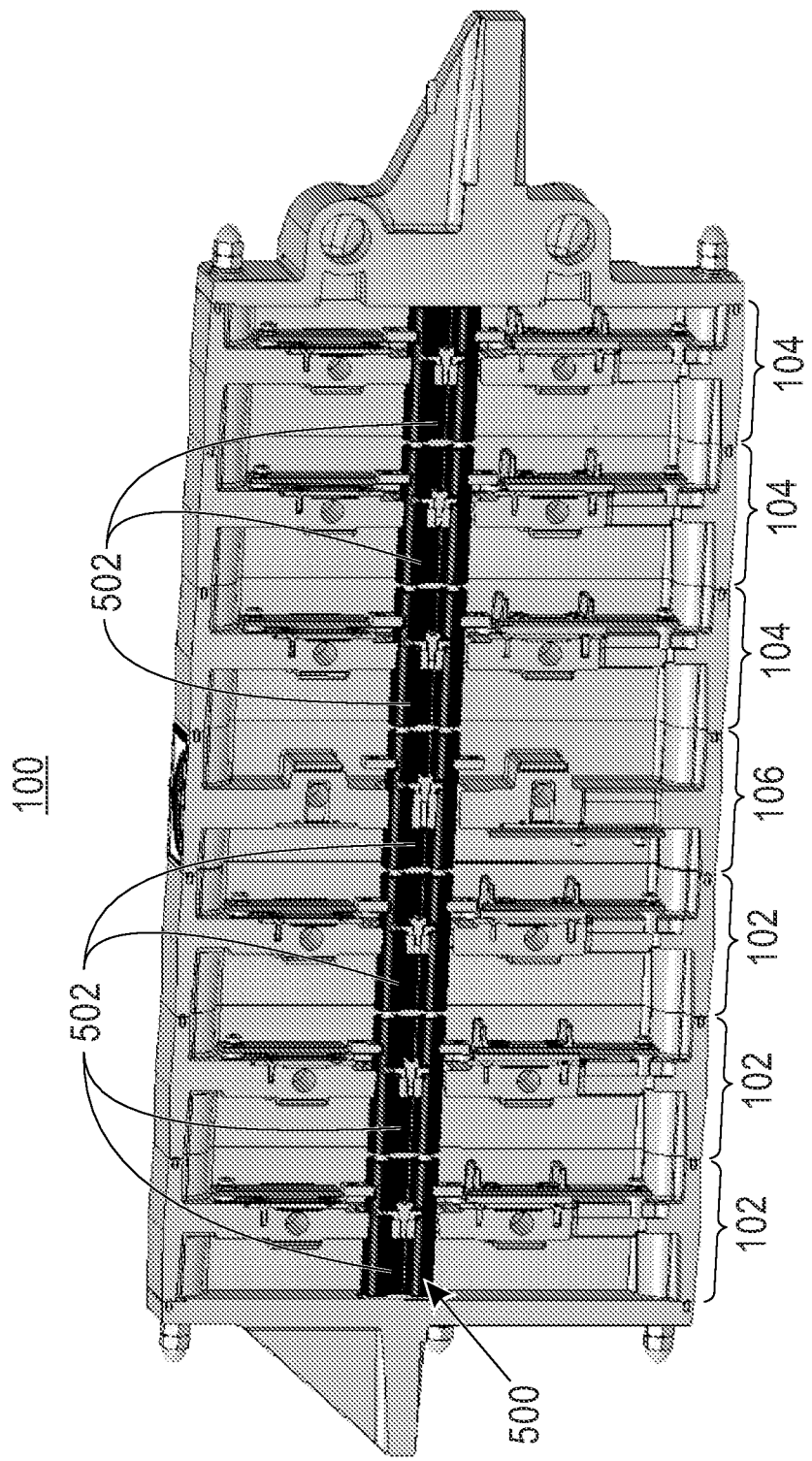
FIG. 12 is a perspective cross-sectional view of an LRU showing one embodiment of a high voltage backbone.

FIG. 12 is a cross-sectional view of the LRU 100 showing one embodiment of a high voltage backbone 500 electrically connecting the circuits of each of the modules 102, 104 and 106. In one embodiment, high voltage backbone forms the high voltage bus 82 of FIG. 3. The high voltage backbone 500 includes an individual connector 502 for each module of the LRU 100.

Figure 13:
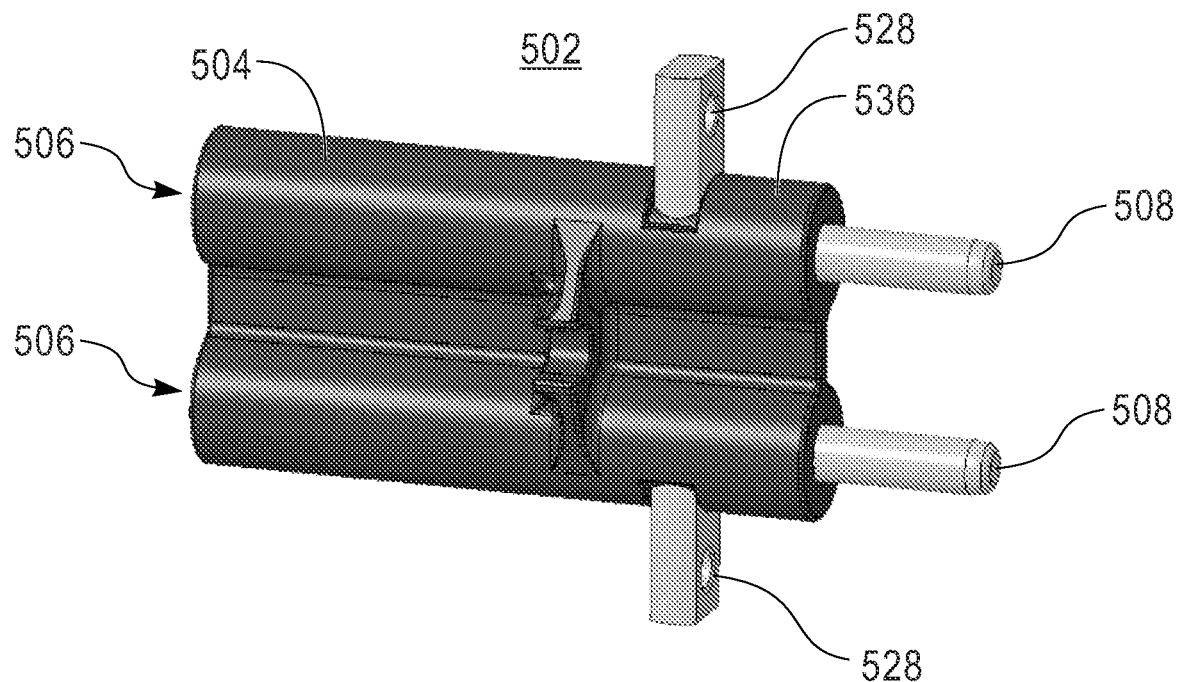
FIG. 13 is one embodiment of a single connector of the high voltage backbone.
Figure 14:
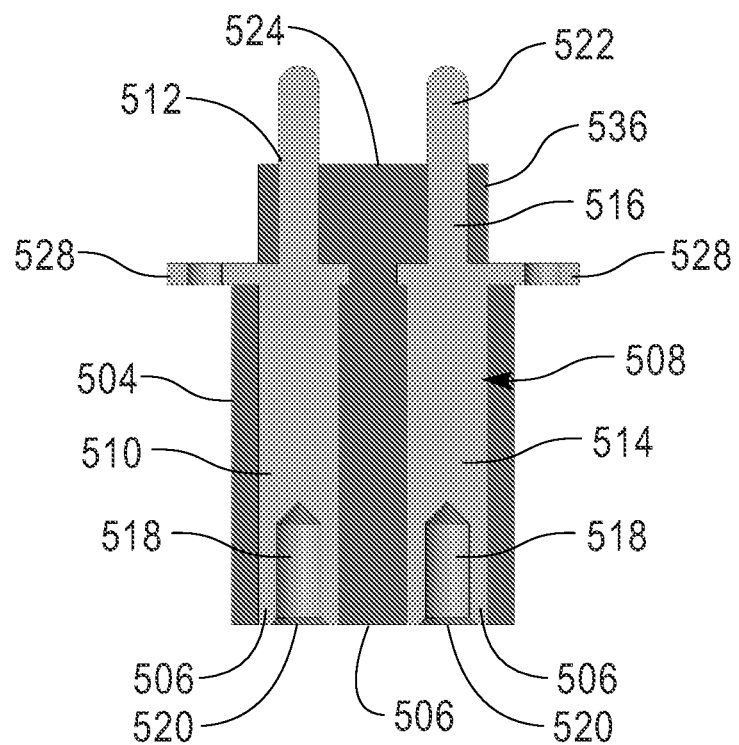
FIG. 14 is a cross-sectional view of one embodiment of a single connector of the high voltage backbone.

As shown in FIG. 13, in one embodiment, connector 502 includes a body 504 having pair of internal sleeves 506 extending all the way through the body 504. A pair of conductive pins 508 fit within each sleeve 506. As shown in the cross-section of the connector 502 shown in FIG. 14, the sleeves 506 have a wide section 510 and a narrow section 512. The pins 508 have a corresponding wide portion 514 and narrow portion 516 that fit tightly within wide section 510 and a narrow section 512, respectively. A part 522 of the narrow portion 516 extends outward from one end 524 of the body 504 The wide portion 514 has a channel 518 with an opening 520 flush with the end 526 of the body 504. The part 522 of the pins 508 fits tightly into the channel 518 so that the connectors 502 are easily connected together in a stack as shown in FIG. 12. The connectors 502 form a male/female blind mate-able connector that allows the modules to be easily and quickly assembled or disassembled.

The pins 508 have tabs 528 extending from one side of the pin 508 to connect to the module circuit board for delivering or receiving power. The side tabs 528 allow the connectors to be continually stacked which enables the modular stackable design of the LRU 100. The side tabs 528 can be connected to a circuit board using bus bars or the tabs 528 may be directly mounted the circuit board. As shown in each of FIGS. 6A, 6B, 7A, 7B, 8A and 8B, openings 530, 532 and 534, respectively are providing in the center platforms 162, 192 and 232, respectively to allow a connector 502 to extend through each module chassis 150, 180 and 22, respectively. As shown in FIGS. 6D, 7D and 8D, the portion 536 of the connector body 504 above the tabs 528 extends above the CCA 72. As shown in FIGS. 6D and 7D, the tabs 528 are directly mounted to the CCA 72 and CCA 68, respectively, to receive power from the backbone 500. As shown in FIG. 8D, tabs 528 are directly mounted to circuit board 76 to deliver power to the backbone 500. As shown in FIGS. 6C, 7C and 8C, the female end of the connectors 502 extend through the module in order to receive male parts 522 of the pins 508 of the neighbor module stacked together to form LRU 100.

Figure 15:
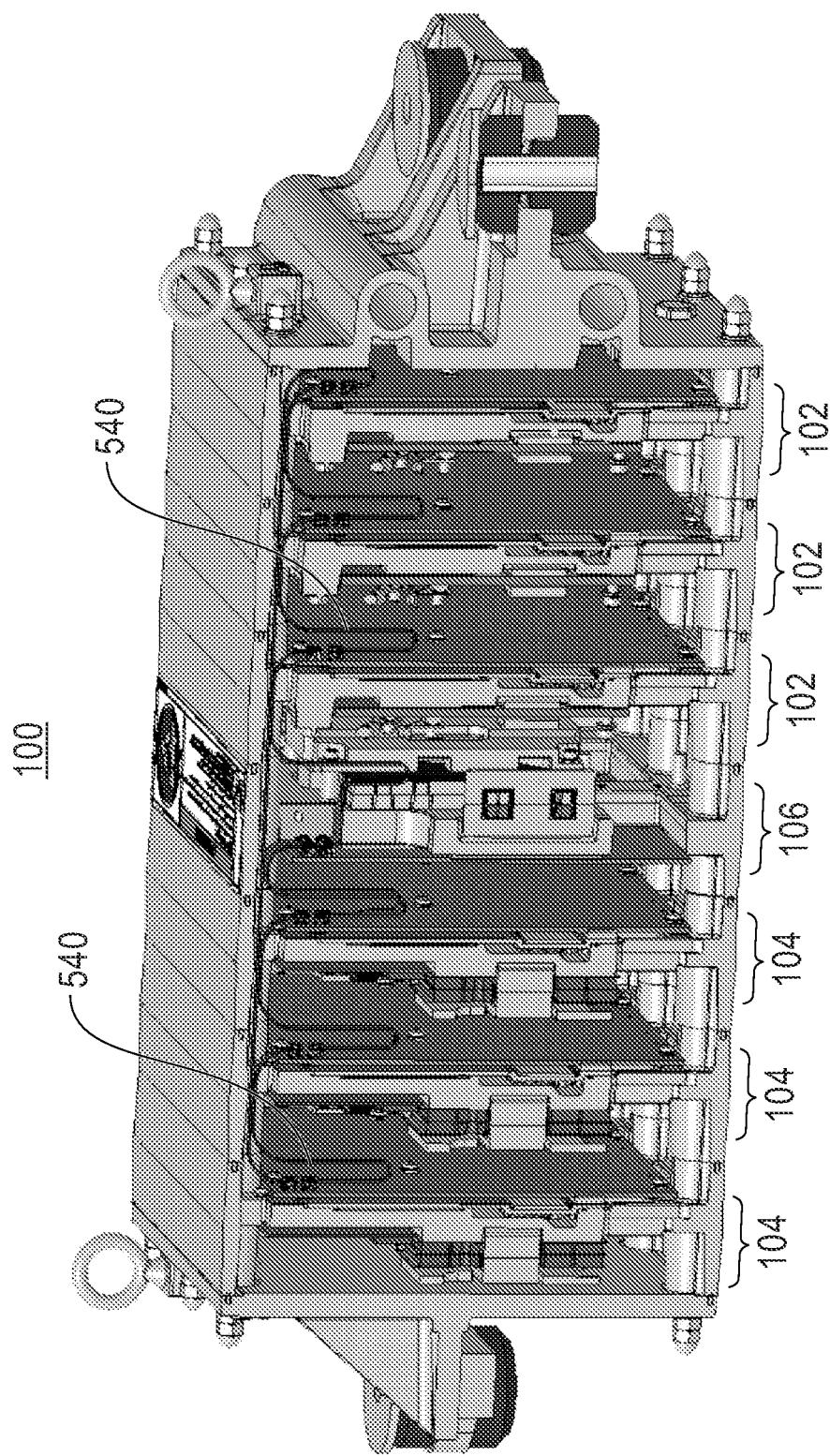
FIG. 15 is a perspective cross-sectional view of one embodiment of an LRU showing a ribbon cable connecting the modules.

As shown in FIG. 15, in one embodiment, the LRU 100 includes a ribbon cable 540 serving as the power bus 80 of FIG. 3, for delivering power from the I/O module 66/106 to each of the AC modules 62/102 and DC modules 64/104. In one embodiment, the ribbon cable 540 also provides the CAN network connection between each of the modules. In one embodiment, the CAN network 78 goes onto each CCA, through each CCA, and then back out each CCA on the backbone 508. The CAN information branches off that backbone 500 on the CCA to go to the FPGA of each CCA. The ribbon cable 540 going from each control CCA of I/O module is shown in FIG. 15. The control signals branch off the ribbon cable 540 with circuitry on the CCAs.

FIG. 12 shows the HV backbone. It goes through the entire unit and then small busbars tap off that from item 528 in FIG. 14 and go to either the control CCA or the I/O CCA depending on the module. The control CCA of each module then passes switched HV over to the AC filter CCA or the DC converter CCA.

Returning to FIG. 15, up to 100 A runs into the I/O module and to the backbone 540, at which point, each control CCA taps into it via a busbar to take some amount of current. The DC modules can draw up to 11.2 A each and the AC modules draw about 22.5 A each.

Figure 16:
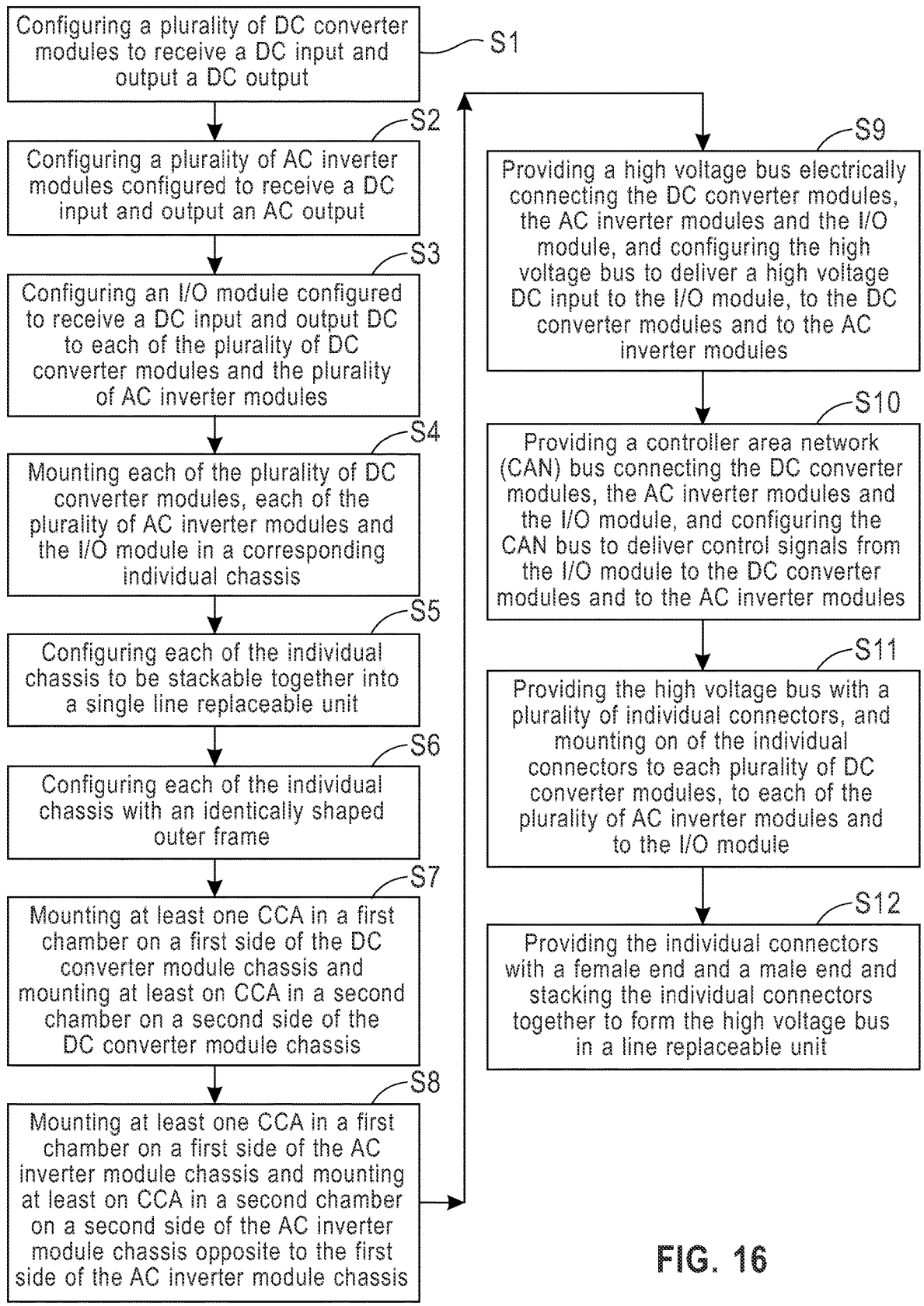
FIG. 16 is a flow diagram of one embodiment of a method of providing a power supply.

FIG. 16 is a flow diagram of one embodiment of a method for providing a power supply. The method includes steps: S1 of configuring an I/O module to receive a high voltage DC input and output a high voltage DC, S2 of configuring a plurality of DC converter modules to receive the high voltage DC output from the I/O module and output a low voltage DC output, and S3 of configuring a plurality of AC inverter modules to receive the high voltage DC output from the I/O module and output a high voltage AC output.

The method may also include steps: S4 of mounting each of the plurality of DC converter modules, each of the plurality of AC inverter modules and the I/O module in a corresponding individual chassis, S5 of configuring each of the individual chassis to be stackable together into a single line replaceable unit, and S6 of configuring each of the individual chassis with an identically shaped outer frame.

The method may also include steps: S7 of mounting at least one CCA in a first chamber on a first side of the DC converter module chassis and mounting at least one CCA in a second chamber on a second side of the DC converter module chassis and S8 of mounting at least one CCA in a first chamber on a first side of the AC inverter module chassis and mounting at least one CCA in a second chamber on a second side of the AC inverter module chassis opposite to the first side of the AC inverter module chassis.

The method may also include step S9 of providing a high voltage bus electrically connecting the DC converter modules, the AC inverter modules and the I/O module, and configuring the high voltage bus to deliver a high voltage DC input to the I/O module, to the DC converter modules and to the AC inverter modules.

The method may also include step S10 of providing a controller area network (CAN) bus connecting the DC converter modules, the AC inverter modules and the I/O module, and configuring the CAN bus to deliver control signals from the I/O module to the DC converter modules and to the AC inverter modules.

The method may also include steps: S11 of providing the high voltage bus with a plurality of individual connectors, and mounting one of the individual connectors to each of plurality of DC converter modules, to each of the plurality of AC inverter modules and to the I/O module and S12 of providing the individual connectors with a female end and a male end and stacking the individual connectors together to form the high voltage bus in a line replaceable unit.

Figure 17:
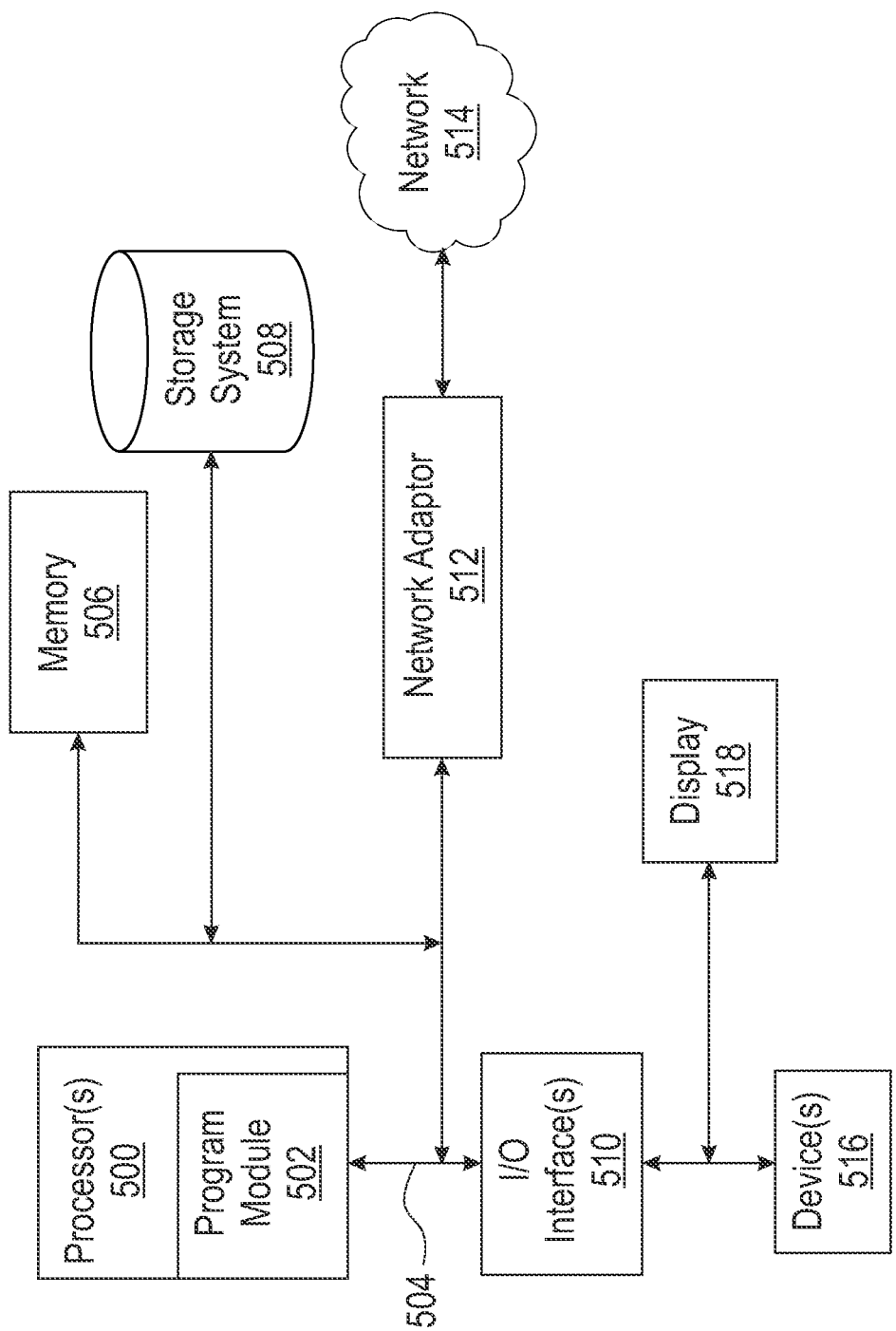
FIG. 17 is a block diagram of an exemplary computing system suitable for implementation of the embodiments disclosed in this specification.

FIG. 17 is one embodiment of a block diagram of an example computer or processing system that may implement the controllers 330 and 430 of the present disclosure. The computer system of FIG. 17 is only one example of a suitable processing system that may be used to implement the controllers 330 and 430 and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 17 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, field programmable gate arrays and distributed cloud computing environments that include any of the above systems or devices, and the like.

The components of the computer system may include, but are not limited to, one or more processors or processing units 500, a system memory 506, and a bus 504 that couples various system components including system memory 506 to processor 500. The processor 500 may include a program module 502 that performs the functions described herein and shown in the circuit diagrams of FIGS. 9, 10 and 11. The module 502 may be programmed into the integrated circuits of the processor 500, or loaded from memory 506, storage device 508, or network 514 or combinations thereof.

Bus 504 may represent one or more of any of several types of bus structures, including a memory bus or memory controller, a peripheral bus, an accelerated graphics port, and a processor or local bus using any of a variety of bus architectures. By way of example, and not limitation, such architectures include Controller Area Network (CAN) bus, Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system may include a variety of computer system readable media. Such media may be any available media that is accessible by computer system, and it may include both volatile and non-volatile media, removable and non-removable media.

System memory 506 can include computer system readable media in the form of volatile memory, such as random access memory (RAM) and/or cache memory or others. Computer system may further include other removable/non-removable, volatile/non-volatile computer system storage media. By way of example only, storage system 508 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

The computer system may also communicate with one or more external devices 516 such as a keyboard, a pointing device, a display 518, etc.; one or more devices that enable a user to interact with computer system; and/or any devices (e.g., network card, modem, etc.) that enable computer system to communicate with one or more other computing devices. Such communication can occur via Input/Output (I/O) interfaces 510.

Still yet, the computer system can communicate with one or more networks 114 such as a local area network (LAN), a general wide area network (WAN), and/or a public network (e.g., the Internet) via network adapter 512. As depicted, network adapter 512 communicates with the other components of computer system via bus 504. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the network address configuration methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network. The computer software applications disclosed herein may include any number of different modules, submodules, or other components of distinct functionality, and can provide information to, or receive information from, still other components. These modules can be used, for example, to communicate with input and/or output devices such as a display screen, a touch sensitive surface, a printer, and/or any other suitable device. Other components and functionality not reflected in the illustrations will be apparent in light of this disclosure, and it will be appreciated that other embodiments are not limited to any particular hardware or software configuration. Thus in other embodiments system may comprise additional, fewer, or alternative subcomponents as compared to those included in the example embodiments.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments disclosed herein. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure not be limited by this detailed description, but rather by the claims appended hereto. Future filed applications claiming priority to this application may claim the disclosed subject matter in a different manner, and may generally include any set of one or more elements as variously disclosed or otherwise demonstrated herein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A power supply comprising:
   an I/O module configured to receive a high voltage DC input and a output high voltage DC;
   a plurality of DC converter modules configured to receive the high voltage DC output from the I/O module and output a low voltage DC output;
   a plurality of AC inverter modules configured to receive the high voltage DC output from the I/O module and output a high voltage AC output;
   wherein each of the plurality of DC converter modules, each of the plurality of AC inverter modules and the I/O module are mounted in a corresponding individual chassis; and
   wherein each of the DC converter module chassis each having a first chamber configured to mount at least one circuit card assembly (CCA) on a first side of the DC converter module chassis and a second chamber configured to mount at least one CCA on a second side of the DC converter module chassis opposite to the first side of the DC converter module chassis.

2. The power supply of claim 1, wherein each of the individual chassis are configured to be stackable together into a single line replaceable unit.

3. The power supply of claim 2, wherein each of the individual chassis has an identically shaped outer frame.

4. The power supply of claim 1, wherein each of the AC inverter module chassis each having a first chamber configured to mount at least one CCA on a first side of the chassis and a second chamber configured to mount at least one CCA on a second side of the chassis opposite to the first side of the chassis.

5. The power supply of claim 2, further comprising a high voltage backbone electrically connecting each of the plurality of DC converter modules, each of the plurality of AC inverter modules and the I/O module, the high voltage backbone being configured to deliver a high voltage DC input to the I/O module, to each of the plurality of DC converter modules, and to each of the plurality of AC inverter modules.

6. The power supply of claim 1, further comprising a controller area network (CAN) bus electrically connecting each of the plurality of DC converter modules, each of the plurality of AC inverter modules and the I/O module, the CAN bus being configured to deliver control signals from the I/O module to each of the plurality of DC converter modules and each of the plurality of AC inverter modules.

7. The power supply of claim 5, wherein the high voltage backbone comprises a plurality of individual connectors, one of the individual connectors being electrically mounted to each of plurality of DC converter modules, each of the plurality of AC inverter modules and the I/O module.

8. The power supply of claim 7, wherein the plurality of individual connectors comprises a female end and a male end configured to allow the individual connectors to be connected together in a stack when the individual chassis are stacked together into the single line replaceable unit.

9. A method for providing a power supply comprising:
  configuring an I/O module to receive a high voltage DC input and output a high voltage DC;
  configuring a plurality of DC converter modules to receive the high voltage DC output from the I/O module and output a low voltage DC output;
  configuring a plurality of AC inverter modules to receive the high voltage DC output from the I/O module and output a high voltage AC output;
  mounting each of the plurality of DC converter modules, each of the plurality of AC inverter modules and the I/O module in a corresponding individual chassis; and
  mounting at least one circuit card assembly (CCA) in a first chamber on a first side of the DC converter module chassis and mounting at least one CCA in a second chamber on a second side of the DC converter module chassis opposite to the first side of the DC converter module chassis.

10. The method of claim 9, further comprising configuring each of the individual chassis to be stackable together into a single line replaceable unit.

11. The method of claim 10, further comprising configuring each of the individual chassis with an identically shaped outer frame.

12. The method of claim 11, further comprising mounting at least one circuit card assembly (CCA) in a first chamber on a first side of the AC inverter module chassis and mounting at least one CCA in a second chamber on a second side of the AC inverter module chassis opposite to the first side of the AC inverter module chassis.

13. The method of claim 10, further comprising providing a high voltage backbone electrically connecting each of the plurality of DC converter modules, each of the plurality of AC inverter modules and the I/O module, and configuring the high voltage backbone to deliver a high voltage DC input to the I/O module, to each of the plurality of DC converter modules and to each of the plurality of AC inverter modules.

14. The method of claim 9, further comprising providing a controller area network (CAN) bus electrically connecting each of the plurality of DC converter modules, each of the plurality of AC inverter modules and the I/O module, and configuring the CAN bus to deliver control signals from the I/O module to each of the plurality of DC converter modules and to each of the plurality of AC inverter modules.

15. The method of claim 13, further comprising providing the high voltage backbone with a plurality of individual connectors, and mounting one of the individual connectors to each of plurality of DC converter modules, to each of the plurality of AC inverter modules and to the I/O module.

16. The method of claim 15, further comprising providing the plurality of individual connectors with a female end and a male end and stacking the individual connectors together to form the high voltage bus in a line replaceable unit.

* * * * *